(12) United States Patent
Kusumoto

(10) Patent No.: US 9,095,066 B2
(45) Date of Patent: Jul. 28, 2015

(54) PRINTED BOARD

(75) Inventor: Naoto Kusumoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 596 days.

(21) Appl. No.: 12/483,102

(22) Filed: Jun. 11, 2009

(65) Prior Publication Data

US 2009/0314535 A1 Dec. 24, 2009

(30) Foreign Application Priority Data

Jun. 18, 2008 (JP) ................. 2008-159260

(51) Int. Cl.
*H05K 3/34* (2006.01)
*H05K 1/11* (2006.01)
*H05K 1/14* (2006.01)

(52) U.S. Cl.
CPC ............ *H05K 1/111* (2013.01); *H05K 1/141* (2013.01); *H05K 3/3442* (2013.01); *H05K 3/341* (2013.01); *H05K 3/3431* (2013.01); *H05K 2201/049* (2013.01); *H05K 2201/09381* (2013.01); *H05K 2201/09427* (2013.01); *H05K 2201/10121* (2013.01); *H05K 2201/10378* (2013.01); *H05K 2201/10636* (2013.01); *H05K 2203/048* (2013.01)

(58) Field of Classification Search
CPC ............ H05K 3/341; H05K 1/0231; H05K 2201/1031; H05K 3/243; H05K 3/301; H05K 1/181; H05K 2201/10909; H05K 3/3421
USPC .......... 174/255, 260; 361/760, 767, 772, 777, 361/808; 257/778, 779, 282; 228/180.21
See application file for complete search history.

(56) References Cited

U.S. PATENT DOCUMENTS

| | | | | |
|---|---|---|---|---|
| 5,446,623 | A * | 8/1995 | Kanetake | 361/760 |
| 5,663,529 | A * | 9/1997 | McMillan et al. | 174/252 |
| 6,115,262 | A * | 9/2000 | Brunner et al. | 361/774 |
| 6,612,023 | B1 | 9/2003 | Lichtenwalter et al. | |
| 6,657,697 | B2 * | 12/2003 | Yamate et al. | 349/151 |
| 6,815,834 | B2 * | 11/2004 | Shimoe et al. | 257/779 |
| 6,867,504 | B2 | 3/2005 | Lichtenwalter et al. | |
| 7,084,353 | B1 * | 8/2006 | Downes | 174/261 |
| 7,186,926 | B2 | 3/2007 | Maeno | |
| 2007/0069340 | A1 | 3/2007 | Yamada et al. | |

(Continued)

FOREIGN PATENT DOCUMENTS

| | | |
|---|---|---|
| EP | 1 565 046 A1 | 8/2005 |
| JP | 62-112179 U | 7/1987 |

(Continued)

*Primary Examiner* — Dion R Ferguson
(74) *Attorney, Agent, or Firm* — Husch Blackwell LLP

(57) ABSTRACT

A printed board is provided, which includes at least a first connecting electrode and a second connecting electrode. A solder is provided over the first connecting electrode and the second connecting electrode, and a chip component is provided over the solder. The chip component includes a first terminal electrode and a second terminal electrode. The first connecting electrode is overlapped with the first terminal electrode and is electrically connected to the first terminal electrode through the solder. The second connecting electrode is overlapped with the second terminal electrode and is electrically connected to the second terminal electrode through the solder. Two corner portions of each of the first connecting electrode and the second connecting electrode are overlapped with two corner portions of each of the first terminal electrode and the second terminal electrode.

6 Claims, 17 Drawing Sheets

(56) References Cited

U.S. PATENT DOCUMENTS

| | | |
|---|---|---|
| 2007/0187790 A1 | 8/2007 | Takahashi et al. |
| 2008/0158839 A1* | 7/2008 | Nishida .................... 361/767 |
| 2008/0203515 A1 | 8/2008 | Kusumoto et al. |
| 2008/0308851 A1 | 12/2008 | Kusumoto et al. |

FOREIGN PATENT DOCUMENTS

| | | |
|---|---|---|
| JP | 62-140772 U | 9/1987 |
| JP | 2-65293 | 3/1990 |
| JP | 3-145739 | 6/1991 |
| JP | 04-176191 A | 6/1992 |
| JP | 5-20367 | 3/1993 |
| JP | 5-148633 | 6/1993 |
| JP | 5-287520 | 11/1993 |
| JP | 7-192663 | 7/1995 |
| JP | 9-199841 | 7/1997 |
| JP | 10-51033 | 2/1998 |
| JP | 10-178262 A | 6/1998 |
| JP | 10-190208 A | 7/1998 |
| JP | 11-191640 | 7/1999 |
| JP | 2001-068841 A | 3/2001 |
| JP | 2003-234567 | 8/2003 |
| JP | 2004-172603 | 6/2004 |
| JP | 2004-335657 | 11/2004 |
| JP | 2005-228885 | 8/2005 |
| JP | 2006-303388 A | 11/2006 |
| JP | 2007-194462 | 8/2007 |

* cited by examiner

PRINTED BOARD

BACKGROUND OF THE INVENTION

1. Field of the Invention

The present invention relates to an insulating substrate obtained by impregnating a glass woven fabric with an epoxy resin or a circuit board (also referred to as a printed board) made of plastic, ceramics, or the like, on a surface of which a chip-shaped electronic component is provided, or a mount structure of a chip-shaped electronic component mounted on a circuit board by solder. In particular, the present invention relates to a mount structure of a chip component having at least two terminals.

2. Description of the Related Art

In recent years, high-density mounting of a chip component on a circuit board has been attempted for reduction in size of electronic appliances. Therefore, a mount structure which needs an area larger than the area of a chip component, such as a lead frame structure in which a side surface of a ceramic or plastic box shape has leads like legs, is not suitable to high-density mounting. A structure called CSP (chip size package) has attracted attention in which electrodes are provided on a bottom surface (undersurface) of a chip component so that an area necessary for mounting is substantially as large as an area occupied by the chip component even after mounting the chip component in order to achieve higher density without using such a lead frame structure. CSP makes it possible to electrically connect a terminal electrode of a chip component and a connecting electrode of a circuit board through the shortest current path and thus shorten a distance between chip components and achieve high-density mounting.

Further, a photoelectric conversion element of which electrode is provided on a bottom surface (undersurface) of a chip component is disclosed in Patent Document 1.

A connecting electrode provided on a circuit board has an area as large as or larger than the area of a terminal electrode of a chip component. Note that the connecting electrode provided on the circuit board is also referred to as a land. BGA (ball grid array), LGA (land grid array), and the like are given as other mounting technologies.

Further, a procedure to mount a chip component on a circuit board is described. First, cream solder is supplied by using a mask having an opening whose shape is substantially the same as that of a connecting electrode of the circuit board to print the cream solder on the connecting electrode of the circuit board. Then, the chip component is mounted on the circuit board so that the connecting electrode is overlapped with the terminal electrode with the cream solder therebetween with a surface of the chip component, on which the terminal electrode is provided, facing downward. After that, reflow solder mounting is performed.

REFERENCE

[Patent Document]
[Patent Document 1] Japanese Published Patent Application No. 2004-172603

SUMMARY OF THE INVENTION

In the case where one chip component having at least two terminal electrodes is mounted on a circuit board, problems occur.

FIG. 14 illustrates an example of the problems.

A comparative example of a top surface shape of a connecting electrode 22 provided on a circuit board 20 is illustrated. In addition, a top surface shape of a terminal electrode 23 of a chip component 24 corresponding to the connecting electrode 22 is also illustrated. As illustrated in FIG. 14A, four corners of the connecting electrode 22 are provided so as not to be overlapped with the terminal electrode 23. Further, the chip component has a plane bottom surface provided with the terminal electrode.

Even when the chip component is mounted on the circuit board so that a bottom surface of the chip component and a plane surface of the circuit board are substantially parallel to each other before reflow is performed, solder melted through the reflow comes to be hemispherical due to surface tension; therefore, the chip component on the solder moves in the direction shown by an arrow in the drawing and thus, the bottom surface of the chip component is inclined with respect to the plane surface of the circuit board after the reflow is completed. As the direction in which the chip component moves, there are the lateral direction 11 of the chip component and the longitudinal direction 12 perpendicular to the lateral direction. Note that the direction in which the chip component moves is not limited to the direction shown by the arrow and the chip component may possibly move obliquely, for example, in a diagonal direction of the chip component. That is, the chip component moves in the horizontal direction or the perpendicular direction while solder below the chip component melts. FIG. 14B illustrates an example of a cross-sectional schematic view of a state where the bottom surface of the chip component 24 is inclined due to the solder 25 which is melted. When the solder is cooled down and solidified, there might occur a problem that the chip component 24 is mounted with the bottom surface thereof inclined. Such a problem can be regarded as defective and leads to reduction in yield.

Further, in the case where such a problem occurs, the degree of inclination is varied, so that fixing strength is varied. In addition to inclination, the position of the chip component is also different between before and after the reflow because the chip component moves in a direction shown by the arrow in the drawing by the reflow. Even in the case where the chip component is provided at a right position by a mounter before the reflow, misalignment might be caused.

In particular, when a small chip component with, for example, a size (length) of 1.2 mm in the longitudinal direction and a size (width) of 1.0 mm in the lateral direction is mounted, the above problem is noticeable. Further, in the case where the total thickness of chip component is 0.3 mm, the above problem is more likely to occur as compared to the case where the total thickness of chip component is 0.55 mm.

An object is to provide a mount structure and a printed board which can achieve high-density mounting and highly-reliable connecting when a chip component is mounted on and connected to a circuit board.

An object is to stabilize a mounting state of a chip component on a circuit board to stably perform connecting in a solder reflow process when a small chip component is mounted.

In specific, an object is to mount a chip component at a predetermined position on a circuit board even in the case where a solder reflow process is performed when a small chip component is mounted.

Further, in specific, an object is to reduce, desirably, prevent inclination of a bottom surface of a chip component fixed to a terminal electrode by solder even in the case where a solder reflow process is performed when a small chip component is mounted.

Further, a circuit board on which a chip component is mounted by solder joint is incorporated in an electronic appliance to be used. There are no problems in the case where the electronic appliance is used in an environment where the temperature is not significantly changed; however, in the case of, for example, an in-vehicle electronic appliance, it is necessary for the in-vehicle electronic appliance used to resist a change in ambient temperature, which is in the range of from below zero to several tens of degrees Celsius and to be reliable in a high-temperature environment and a low-temperature environment or when the environment is changed between a high-temperature environment and a low-temperature environment. Further, it is also necessary for a mobile electronic appliance such as a mobile phone to be reliable in a high-temperature environment and a low-temperature environment regardless of whether it is used indoors or outdoors and where it is used.

An object is to provide a mount structure of a chip component and a printed board which prevent breakage and degradation due to heat history such as heating or cooling even in the case where the heat history is added while the chip component mounted on a surface of the circuit board is used.

To achieve the above objects, the shape of a connecting electrode (land) connected to a chip component by solder is improved.

A chip component having at least two terminal electrodes has a rectangular solid chip shape or a plate chip shape. The chip component having at least two terminal electrodes does not have an electrode on a side surface thereof and has the pair of terminal electrodes on a bottom surface thereof. Further, in this specification, the terminal electrode of the chip component having at least two terminal electrodes does not have a projected portion such as a bump, unlike that of a flip chip, and has a plane surface.

The terminal electrode of the chip component has a top surface having a quadrangular shape such as a square or a rectangle and two electrodes spaced a distance between terminal electrodes $D_e$ apart are paired. The distance between terminal electrodes $D_e$ is set to be in the range where a solder bridge defect in which solder connects between the electrodes to cause a short circuit, or the like does not occur when solder mounting is performed, that is, 0.2 mm or longer, preferably 0.3 mm or longer.

At least two connecting electrodes provided so as to face such at least two terminal electrodes are provided so as to be spaced a distance between connecting electrodes $L_h$ apart on the circuit board.

In a conventional case, the shape of a connecting electrode is also quadrangular, and two corner portions, which are located to be spaced a distance between connecting electrodes $L_h$ apart from two corner portions of the other of connecting electrodes, of four corner portions of one of the connecting electrodes, are located to be spaced apart from two corner portions of a terminal electrode, which are provided closest to the two corner portions of the one of the connecting electrodes.

The distance between connecting electrodes $L_h$ and the distance between terminal electrodes $D_e$ are set to be substantially equal to each other as illustrated in FIG. 15A, unlike in the case of the connecting electrode illustrated in FIG. 14A. Accordingly, a chip component 34 is prevented from moving in the lateral direction of the chip component in a solder reflow process. However, with a mount structure of FIG. 15A, the full width $(2L_m+L_w)$ of the connecting electrode is longer than the length of a long side W of a terminal electrode 33; therefore, it is difficult to prevent the chip component 34 from moving in the lateral direction 30 of the chip component perpendicular to the longitudinal direction in the solder reflow process.

The shape of the top surface of a connecting electrode 42 is set to be the same as that of the terminal electrode and each side of the connecting electrode is set to be substantially the same as that of the terminal electrode as illustrated in FIG. 15B unlike in the case of the connecting electrode illustrated FIG. 15A. That is, the area of a plane surface of the connecting electrode is set to be the same as that of the terminal electrode. As for the shape of the top surface of the connecting electrode 42 in FIG. 15B, the length of a long side W of the terminal electrode is equal to the full width $(2L_m+L_w)$ of the connecting electrode. Further, the distance between connecting electrodes $L_h$ and the distance between terminal electrodes $D_e$ are set to be substantially equal to each other. In this manner, the chip component can be prevented from moving in the longitudinal direction and the lateral direction of the chip component in the solder reflow process. However, with the shape of the top surface of the connecting electrode 42 in FIG. 15B, although the chip component can be prevented from moving, it is difficult to prevent inclination of a bottom surface of the chip component.

To reduce inclination of the bottom surface of the chip component, the top surface shape of the connecting electrode is differentiated from that of the terminal electrode. Note that the length of each of two closest parallel sides of two connecting electrodes is substantially equal to the length of the long side W of the terminal electrode. In this manner, two corner portions of one of the connecting electrodes can be provided so as to be close to two corner portions of one of the terminal electrodes, or preferably, four vertices of the connecting electrode are made to correspond to four vertices of the terminal electrode. That is, four corner portions located at both ends of the closest parallel two sides of the two connecting electrodes (four corner portions in total of the two connecting electrodes) are provided so as to be close to four corner portions in total of the two terminal electrodes. In this manner, the chip component can be prevented from moving in the longitudinal direction and the lateral direction of the chip component in the solder reflow process and the bottom surface of the chip component can be prevented from being inclined. Thus, it is advantageous to differentiate the top surface shape of the connecting electrode from that of the terminal electrode in that the bottom surface of the chip component can be prevented from being inclined.

Note that in the case where the connecting electrode is overlapped with a chip component, the area of the connecting electrode is preferably larger than that of the terminal electrode of the chip component, and the top surface of the connecting electrode preferably has a portion protruding from the edge of the terminal electrode. In specific, the shape of the connecting electrode is a hexagon or a polygon having more than six corners. Further, the area of part of the connecting electrode, which is overlapped with the terminal electrode, is as large as the area of the terminal electrode, and the whole area of the connecting electrode is larger than that of the terminal electrode. It is important to increase the area of the connecting electrode in controlling the amount of solder. Further, it is important that the area of part of the connecting electrode, which is overlapped with the terminal electrode, is as large as the area of the terminal electrode in ensuring fixing strength of the chip component, because the area for fixing the chip component is increased. By ensuring fixing strength, high reliability can be achieved and thus breakage and degradation due to heat history such as heating or cooling can be prevented even in the case where the heat history is added while the chip component mounted on a surface of the circuit board is used.

An embodiment to be disclosed of the present invention in this specification is a printed board having at least two connecting electrodes fixing at least two corresponding terminal electrodes of a chip component on a surface of the printed board, in which a bottom surface of the chip component is provided with the two terminal electrodes which are parallel to a centerline in the longitudinal direction of the chip component; one of the connecting electrodes has a different top surface shape and a larger area from/than one of the terminal electrodes; and the chip component is mounted on the surface of the printed board with solder provided between the connecting electrode and the terminal electrode interposed between the chip component and the surface of the printed board.

In an embodiment of the present invention, it is advantageous that the top surface of the connecting electrode has a shape of which width increases from the width between both ends of one side thereof in a direction apart from the one side although one side of the terminal electrode is substantially as long as the one side of the connecting electrode.

In addition, in the case where it is assumed that an internal angle of the terminal electrode having a quadrangular shape is 90 degrees, by setting an internal angle $\theta$ at a vertex of the connecting electrode, which corresponds to a vertex of the terminal electrode, to larger than or equal to 90 degrees and smaller than 180 degrees, preferably larger than or equal to 105 degrees and smaller than or equal to 155 degrees, a self-alignment effect (self-alignment function) can be achieved in a solder reflow process. The self-alignment effect is that in a solder reflow process, the shape of solder which is melted is changed due to surface tension so that the surface area of the solder is as small as possible while being bonded to the chip component and consequently, the chip component is moved due to surface tension of the solder and positioned at a desired position. The self-alignment effect is achieved, so that the chip component mounted on the circuit board by a chip mounter is connected at a predetermined position by reflow solder mounting. Accordingly, such a mounting process becomes possible in which assembling can be easily performed even in the case where the sizes of the chip component and the terminal electrode are small even by an inexpensive device such as a chip mounter which might cause large misalignment.

The internal angle $\theta$ at a vertex of the connecting electrode is set to larger than or equal to 90 degrees and smaller than 180 degrees, preferably larger than or equal to 105 degrees and smaller than or equal to 155 degrees, which means that the connecting electrode has a portion protruding from the edge of the terminal electrode. The length of each of two closest parallel sides of two connecting electrodes is set to substantially equal to the length of the long side W of the terminal electrode.

Another embodiment of the present invention, in which the top surface of the connecting electrode has a shape of which width increases from the width between both ends of one side thereof in a direction apart from the one side is a printed board having at least two connecting electrodes fixing at least two corresponding terminal electrodes of a chip component on a surface of the printed board, in which the connecting electrode is overlapped with the terminal electrode; a top surface of the terminal electrode has a quadrangular shape; two corner portions located at both ends of one side of the terminal electrode overlap with two corner portions located at both ends of one side of the connecting electrode with solder therebetween; a top surface of the chip component has a quadrangular shape with long sides and short sides; the top surface of the connecting electrode has a shape of which width increases from the width between the two corner portions in a direction apart from the centerline in the longitudinal direction of the chip component; and the chip component is mounted on the surface of the printed board with the solder therebetween.

The above embodiment of the present invention achieves at least one of the aforementioned objects. By employing the above circuit board, that is, the printed board having the connecting electrodes on the surface thereof, inclination of a bottom surface of the chip component can be reduced. Further, by employing the printed board having the connecting electrodes on the surface thereof, variation in inclination of the bottom surface of the chip component can be reduced. In particular, in the case where the chip component is a photoelectric conversion element such as a photosensor, the angle of incident light is changed due to inclination of the chip component, which may possibly change an output value. Further, by employing the printed board having the connecting electrodes on the surface thereof, a decrease in fixing strength due to inclination of the chip component can be prevented and thus variation in fixing strength can be reduced.

In the above structure, one of the shapes of the connecting electrode is an inequilateral hexagonal shape obtained by cutting two corner portions from a rectangular shape. The shape of the connecting electrode is, for example, an inequilateral hexagonal shape having two internal angles which are right angles among six internal angles as illustrated in FIG. 1A.

The shape of the connecting electrode is not particularly limited as long as it is a shape of which width increases "continuously" or "discontinuously" from the width between the two corner portions in a direction apart from the centerline in the longitudinal direction of the chip component. For example, cut portions corresponding to two corner portions of a rectangular shape may be curved. An electrode shape "continuous" in one direction from corner portions means that an outer rim of the electrode is a straight line or a curved line extended from the corner portions, whereas an electrode shape "discontinuous" in one direction from corner portions means that an outer rim of the electrode is a finely stepped line extended from the corner portions. Alternatively, the shape of the connecting electrode may be a shape having at least one rounded corner portion, for example, an elongated elliptical shape of which middle part is bent.

Further, to increase an area where height of melted solder is even, it is preferable to further devise the shape of the connecting electrode. The cross-sectional shape of the melted solder is significantly affected by the shape of the connecting electrode. The melted solder is to have a semi-ellipsoidal shape; therefore, in the case where the shape of the connecting electrode is a quadrangular, the melted solder is to have a semi-ellipsoidal shape with a center part of the connecting electrode regarded as a center. By employing a complex shape as the shape of the connecting electrode, an area where height of the melted solder is even is increased. In specific, it is desirable to employ a complex polygonal shape obtained by cutting a middle part adjacent to a longest side of an inequilateral hexagonal shape of which two of six internal angles are right angles from the inequilateral hexagonal shape. In specific, employed is a shape having a bent portion protruding between one end and the other end of the shape, for example, a decagonal shape illustrated in FIG. 3A. The distance between the pair of connecting electrodes is substantially uniform and substantially equal to the distance between the terminal electrodes. The shape of the connecting electrode having a bent portion contributes to achievement of a self-alignment effect. By employing the shape illustrated in FIG. 3A, the shape of an upper part of melted solder can be a banana shape in which the width of a middle part of the melted solder is substantially equal to the length of a short side of the terminal electrode and the width of each of both ends of the melted solder is larger than the length of the short side of the terminal electrode. Further, as for the cross-sectional shape of the melted solder, the melted solder spreads so that it has a semi-ellipsoid with one top at a center of one end, a semi-ellipsoid with one top at a center of the other end, and a semi-ellipsoid with one top in a middle part, that is, three tops in total in accordance with the shape of the connecting electrode, and an area where height of the melted solder is even is increased. The height of the solder is even in a large area, so that inclination of the bottom surface of the chip component can be further suppressed.

Further, by employing the shape illustrated in FIG. 3A, the area of the connecting electrode can be reduced as compared to that of the connecting electrode in FIGS. 1A and 1B. Another embodiment of the present invention is a printed board having at least two connecting electrodes fixing at least two corresponding terminal electrodes of a chip component on a surface of the printed board, in which a top surface of the terminal electrode has a quadrangular shape; two corner portions located at both ends of one side of the terminal electrode overlap with two corner portions of the connecting electrode with solder therebetween; the top surface of the connecting electrode has a shape having a bent portion between one end and the other end of the shape; the two connecting electrodes are provided so that protruding bent portions are closest to each other with a centerline in the longitudinal direction of the chip component interposed therebetween; and the chip component is mounted on the surface of the printed board with the solder therebetween.

An embodiment of the present invention achieves at least one of the above objects.

Note that in this specification, a connecting electrode and a wiring are integrally formed, so that the shape of the connecting electrode refers to a shape except a wiring portion. Note that solder is hardly attached to the wiring portion; therefore, a portion to which solder is attached can also be referred to as a connecting electrode.

The means described above are not only design items but items devised after enough investigation is conducted by the inventor and the like as follows: a variety of land shapes are formed experimentally, solder reflow is performed, and a chip component is mounted on a circuit board having a land.

In the case where not only a bottom surface of a chip component but a side surface thereof is provided with an electrode, a phenomenon called Manhattan phenomenon (tombstone phenomenon) may occur. This phenomenon is likely to occur when there is a difference in wettability against solder between terminal electrodes in a reflow process or a difference in temperature for solder mounting. To prevent this phenomenon, the rim of a terminal electrode of a chip component having the terminal electrode also on a side surface thereof is provided on an inner side than the rim of a connecting electrode (land) and a solder fillet is formed so as to surround the rim of the terminal electrode. That is, the chip component having the terminal electrode also on the side surface thereof is designed so that the distance between connecting electrodes $L_h$ is smaller than the distance between terminal electrodes $D_e$. In an embodiment of the present invention, it is not assumed that such a chip component having a terminal electrode also on a side surface thereof is used, and the positional relation between the connecting electrode and the terminal electrode and the shape of the connecting electrode are significantly different.

As the chip component assumed in this specification, an element having a structure having at least two electrodes on a bottom surface (undersurface), that is, a bottom electrode structure, for example, a photoelectric conversion element such as a photo IC having a bottom electrode structure, a chip capacitor such as a tantalum capacitor having a bottom electrode structure, and the like are given. In this specification, a circuit board refers to a printed wiring board (PWB), a printed circuit board (PCB), or the like. Further, a chip component may be mounted on an interposer and the interposer may be mounted on a circuit board. In the case where a chip component is mounted on an interposer, the shape of the connecting electrode described above is employed as the shape of a connecting electrode of the interposer. In this case, a printed board on which an interposer having at least two connecting electrodes fixing at least two corresponding terminal electrodes of a chip component on a surface of the interposer is mounted is formed.

A term indicating a direction such as on, over, under, below, side, horizontal, or perpendicular in this specification refers to a direction based on a substrate surface in the case a device is provided over the substrate surface. For example, in the case where a chip component is provided on a circuit board, description is made based on a surface of the circuit board, and in the case where an element is formed over a substrate over which a chip component is formed, description is made based on a surface of the substrate over which the chip component is formed.

A term indicating a degree such as about or substantially in this specification refers to a degree of reasonable deviation of a word indicating a degree so that a final result is not significantly changed. These terms should be construed as including deviation of at least ±5% of the word and it is required that this deviation does not deny the meaning of the word.

When mounting and connecting a chip component on/to a circuit board, high-density mounting and highly-reliable connecting can be achieved.

Further, even in the case where a solder reflow process is performed when a small chip component is mounted, the chip component can be mounted at a desired position of a circuit board.

Further, even in the case where a solder reflow process is performed when a small chip component is mounted, inclination of a bottom surface of the chip component fixed to a terminal electrode by solder can be reduced or prevented.

DETAILED DESCRIPTION OF THE INVENTION

Embodiments of the present invention are described below.

Embodiment 1

Figure 1A:
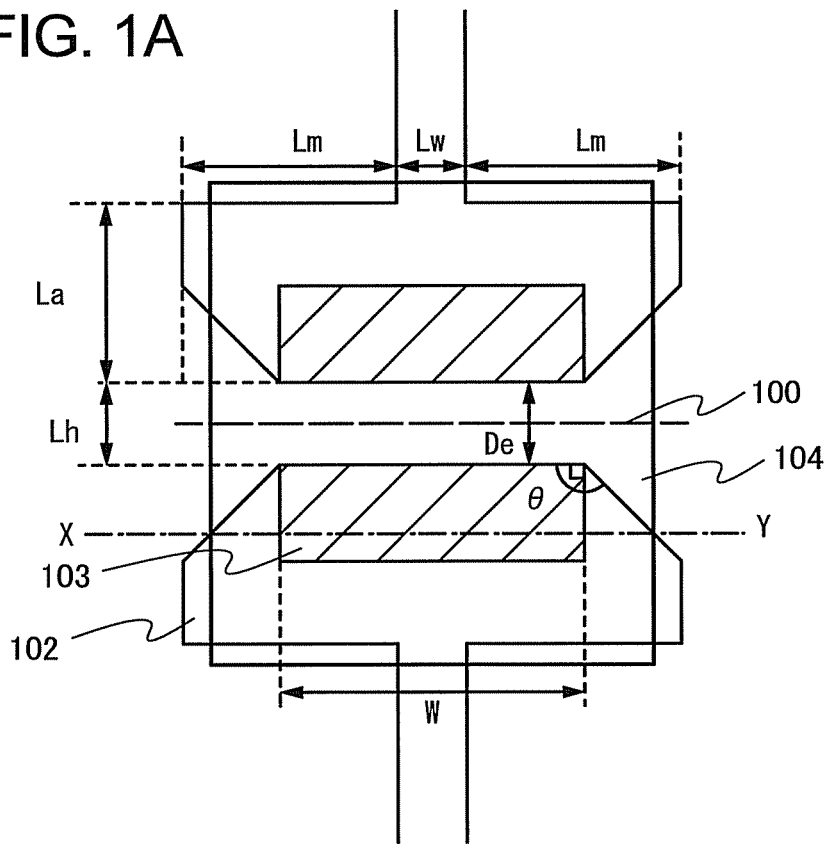
FIGS. 1A and 1B are a top view and a cross-sectional view illustrating an example of positional relation between a terminal electrode and a connecting electrode of a chip component, respectively.

FIG. 1A is an example of a top view illustrating a mount structure of a printed board having at least two connecting electrodes fixing at least two corresponding terminal electrodes of a chip component on a surface of the printed board.

Here, an example is illustrated in which a minute chip component with a size of 1.2 mm×1.0 mm, specifically a chip having a bottom electrode structure and including a photosensor, is mounted on a circuit board.

A bottom surface of a chip component 104 is provided with two terminal electrodes 103 which are parallel to a centerline in the longitudinal direction of the chip component. The distance between the two terminal electrodes $D_e$ is 0.3 mm. The lower limit of the distance between terminal electrodes $D_e$ is 0.2 mm and the upper limit thereof is a value obtained by subtracting the length of short sides of the two terminal electrodes from the length of the longitudinal direction of the chip. The terminal electrode has a rectangular shape with a pair of short sides and a pair of long sides. The long sides are parallel to a centerline 100 in the longitudinal direction of the chip component, which is shown by a dashed line in FIG. 1A. The length of the short side is 0.35 mm and the length W of the long side is 0.8 mm.

Figure 1B:
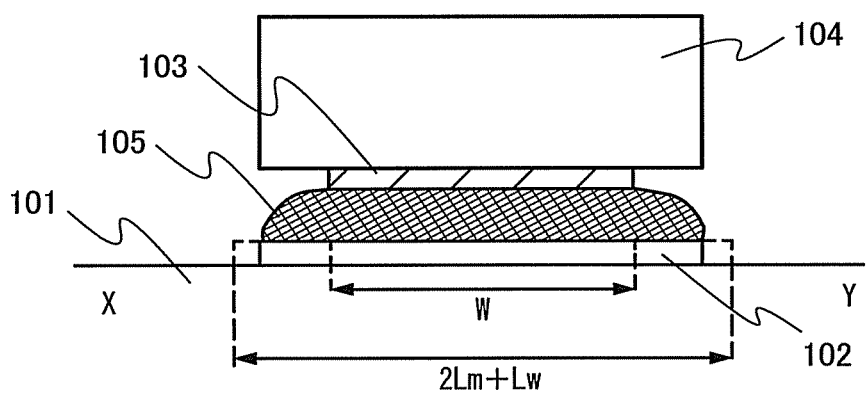

Although solder is not illustrated for simplicity in FIG. 1A, solder 105 is illustrated in FIG. 1B which is a cross-sectional view taken along dashed-dotted line X-Y in FIG. 1A.

Two connecting electrodes 102 are provided over a circuit board 101. As illustrated in FIG. 1B, the connecting electrodes 102 are overlapped with the terminal electrodes 103 with the solder 105 therebetween and the chip component 104 is mounted on the circuit board 101. Cream solder is printed on the two connecting electrodes 102 provided over the circuit board 101 to mount the chip component 104 on the two connecting electrodes 102. Then, the cream solder is heated to be melted in a reflow furnace (this process is also referred to as solder reflow), whereby solder joint is performed. Thus, a mount structure illustrated in a cross-sectional view of FIG. 1B can be obtained. The cream solder is one of adhesives for mounting electronic components and is made by mixing solder powder and a flux paste. Further, the substance for electrically connecting the terminal electrodes 103 and the connecting electrodes 102 is not limited to cream solder and may be any other adhesive for mounting electronic components, such as lead-free solder without lead (also referred to as lead-free cream solder) or any other conductive paste.

The top surface of the connecting electrode 102 has a quadrangular shape with a short side of 0.65 mm and a long side of 1.5 mm, from which two corner portions are cut stopping 0.35 mm from vertices, which can be called an inequilateral hexagonal shape of which two internal angles are each 90 degrees.

Note that the two connecting electrodes 102 are axisymmetrical with respect to the centerline 100 in the longitudinal direction of the chip component. Further, in the case of assuming that the centerline 100 side is an inner side and a side opposite to the centerline 100 side is an outer side in the chip component, it can be said that each of the connecting electrodes has a top surface of which width on the inner side is small and which is widened toward the outer side.

To prevent the bottom surface of the chip component from being inclined due to the move of the chip component 104 in the solder reflow, the distance between connecting electrodes $L_h$ of the two connecting electrodes 102 is set to be equal to the distance between terminal electrodes $D_e$, and the area of one of the connecting electrodes (0.85 mm$^2$) is set to be larger than the area of one of the terminal electrodes (0.28 mm$^2$).

Two corner portions located at both ends of the long side of the terminal electrode 103 are made to correspond to corner portions located at both ends of one side of the connecting electrode 102 which is as long as the long side of the terminal electrode. Further, the internal angle θ at the vertex of the connecting electrode corresponding to the vertex of the terminal electrode is set to larger than 90 degrees and smaller than 180 degrees, so that a self-alignment effect can be achieved in the solder reflow process. Here, the internal angle θ at the vertex of the connecting electrode is set to 135 degrees.

Practically, the connecting electrode 102 having a shape illustrated in FIG. 1A is formed experimentally, the chip component is mounted, and whether the chip component is inclined is checked. In addition, as a comparative example, comparison with a sample on which rectangular connecting electrodes 32 are mounted in FIG. 15A is performed.

Figure 15A:
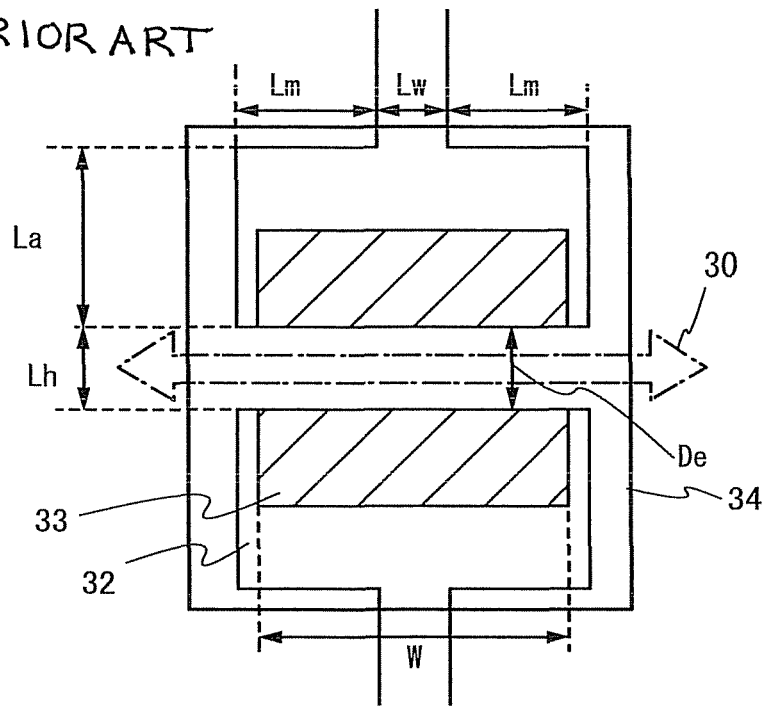
FIGS. 15A and 15B are top views illustrating comparative examples.
Figure 15B:
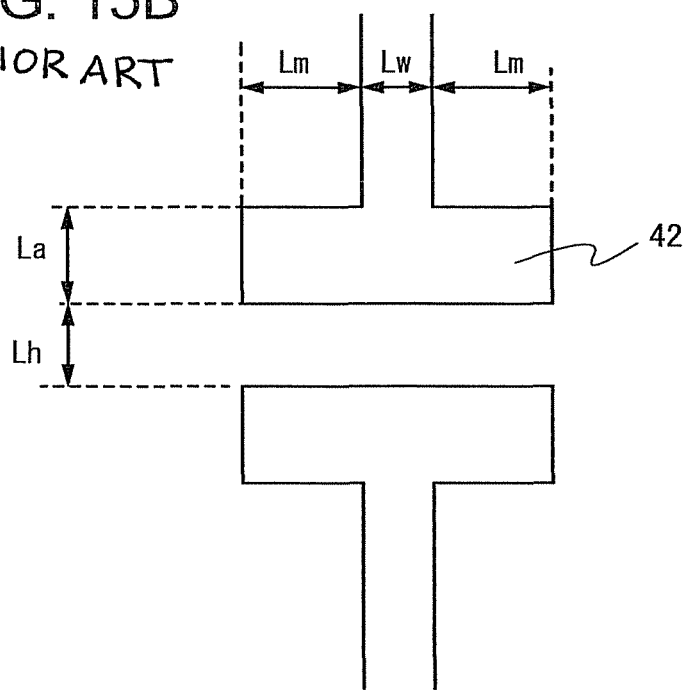

One of the connecting electrodes 32 illustrated in FIG. 15A has a rectangular shape with a short side of 0.65 mm and a long side of 1.0 mm and the area of the connecting electrode 32 is 0.65 mm$^2$.

Further, the size of a terminal electrode 33, the distance between terminal electrodes $D_e$, and the size of a chip component 34 which are illustrated in FIG. 15A are equal to those in FIG. 1A. Note that the thickness of the chip component 34 is about 0.55 mm. Further, the distance between connecting electrodes $L_h$ of the two connecting electrodes 32 is equal to the distance between terminal electrodes $D_e$.

To check whether the chip component is inclined, 22 samples for each example are formed and the check is performed. As a result, as for the connecting electrode having a shape illustrated in FIG. 1A, inclination of the chip component cannot be confirmed in all the 22 samples by visual inspection. Further, as for the connecting electrode having the shape illustrated in FIG. 15A, which is for the comparative example, inclination of the chip component is not able to be confirmed in 3 of the 22 samples by visual inspection.

According to these results, several samples in which chip components are not inclined are obtained by setting the distance between connecting electrodes $L_h$ to be equal to the distance between terminal electrodes $D_e$ also in the comparative example; however, by employing the shape of the connecting electrode illustrated in FIG. 1A, the chip component can be mounted without being inclined in all the samples. In addition, by employing the shape of the connecting electrode illustrated in FIG. 1A, it can also be confirmed that a self-alignment effect is achieved and mounting is performed without misalignment in all the samples.

Therefore, the shape of the connecting electrode illustrated in FIG. 1A is significantly advantageous in mounting through the solder reflow process.

Although a minute chip component with a size of 1.2 mm×1.0 mm is described as an example here, the size of the minute chip component is not particularly limited and can be any of the following: 6.0 mm×3.2 mm, 5.0 mm×3.0 mm, 3.2 mm×1.6 mm, 2.0 mm×1.5 mm, 1.6 mm×0.8 mm, and 1.0 mm×0.5 mm. The thickness of the minute chip component can be 0.2 to 0.8 mm.

Further, the top surface shape of the connecting electrode illustrated in FIG. 1A is only an example. The top surface shape of the connecting electrode is allowable as long as it is different from that of the terminal electrode, has a larger area than the terminal electrode, and is a shape of which width increases continuously or discontinuously from the width between both ends of one side in a direction apart from the centerline in the longitudinal direction of the chip component. Further, as for positional relation between the terminal electrode and the connecting electrode, two corner portions located at both ends of one side of the terminal electrode overlap with two corner portions located at both ends of one side of the connecting electrode with solder therebetween, and the area of part of the connecting electrode, which is overlapped with the terminal electrode, is as large as the area of the terminal electrode.

Figure 2A:
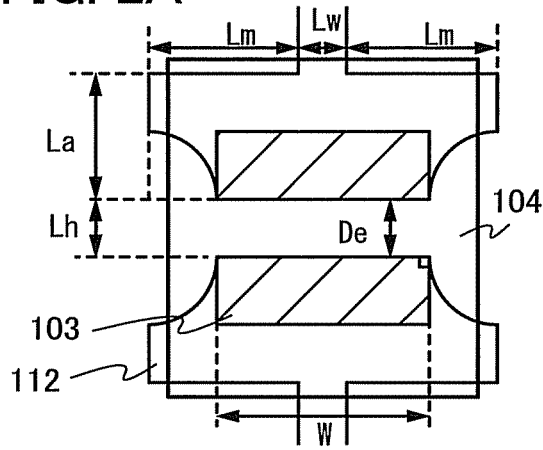
FIGS. 2A to 2E are top views illustrating other examples of positional relation between a terminal electrode and a connecting electrode of a chip component.

FIG. 2A illustrates another example of the top surface shape of a connecting electrode. The top surface shape of a connecting electrode 112 has an outer rim including curved lines extended from two corner portions located at both ends of one side. Further, it can also be said that the top surface shape of the connecting electrode 112 is a rectangular shape from which two corner portions each of which is one quarter of a circle are cut. An ellipse may be employed instead of the circle. With such a top surface shape of the connecting electrode 112, the chip component 104 can be mounted without being inclined and misaligned as in the case of the top surface shape illustrated in FIG. 1A. Note that it is important to cut the quadrant portions of the connecting electrode from part of the connecting electrode, which is not overlapped with the terminal electrode.

Figure 2B:
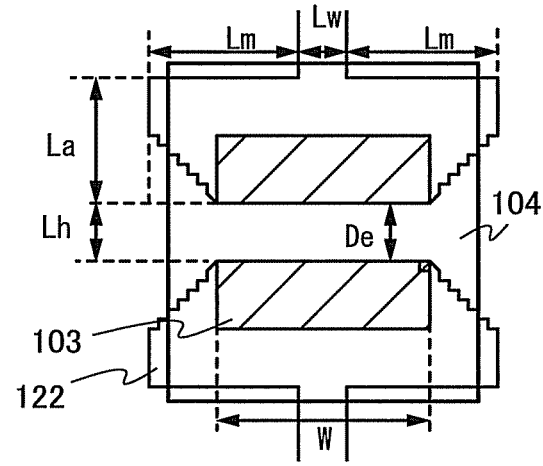

FIG. 2B illustrates another example of the top surface shape of a connecting electrode. The top surface shape of a connecting electrode 122 is a shape of which width increases continuously or discontinuously from the width between both ends of one side in a direction apart from the centerline in the longitudinal direction of the chip component. Part of an outer rim of the top surface shape of the connecting electrode 122 is finely stepped. With such a top surface shape of the connecting electrode 122, the chip component 104 can be mounted without being inclined and misaligned as in the case of the top surface shape illustrated in FIG. 1A. Further, although any part of the outer rim of the top surface shape of the connecting electrode may be finely stepped, it is important that the part of the outer rim of the top surface shape of the connecting electrode is not overlapped with the terminal electrode. This is because in the case where the finely stepped part of the outer rim of the top surface shape of the connecting electrode is overlapped with the terminal electrode, fixing strength might be reduced.

Figure 2C:
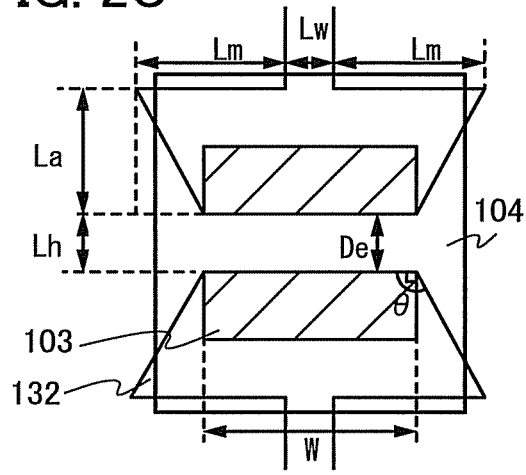

Further, FIG. 2C illustrates another example of the top surface shape of a connecting electrode. The top surface shape of a connecting electrode 132 is a trapezoidal shape of which upper base is as long as a long side of the terminal electrode and the connecting electrode 132 is mounted so that the top base thereof and the long side of the terminal electrode are overlapped with each other. Further, the top surface shape of the connecting electrode 132 in FIG. 2C is also called an isosceles trapezoid. With such a top surface shape of the connecting electrode 132, the chip component 104 can be mounted without being inclined and misaligned as in the case of the top surface shape illustrated in FIG. 1A.

Figure 2D:
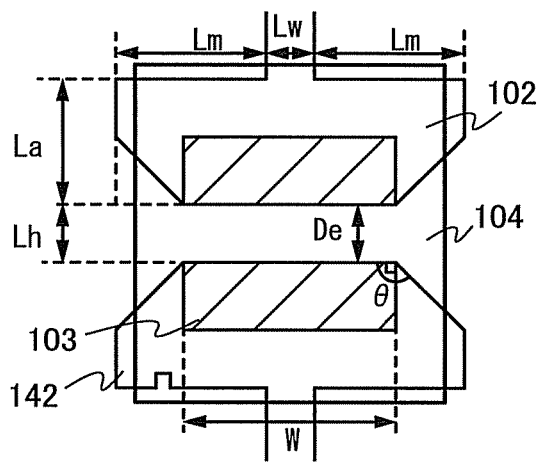

Further, FIG. 2D illustrates another example of the top surface shape of a connecting electrode. A connecting electrode 142 which is one of two connecting electrodes has a cut portion serving as a mark so that for example, the plus side and the minus side can be distinguished. In that case, the connecting electrode 142 which is one of the connecting electrodes has a different shape from a connecting electrode 102 which is the other, which does not have much effect in mounting by solder reflow or the like because the cut portion is small. With such a top surface shape of the connecting electrode 142, the chip component 104 can be mounted without being inclined and misaligned as in the case of the top surface shape illustrated in FIG. 1A. Note that it is important to provide the cut portion of the connecting electrode in part of the connecting electrode, which is not overlapped with the terminal electrode. This is because in the case where the cut portion of the connecting electrode is overlapped with the terminal electrode, fixing strength might be reduced. One of the connecting electrodes may have a projected portion instead of the cut portion serving as a mark.

Figure 2E:
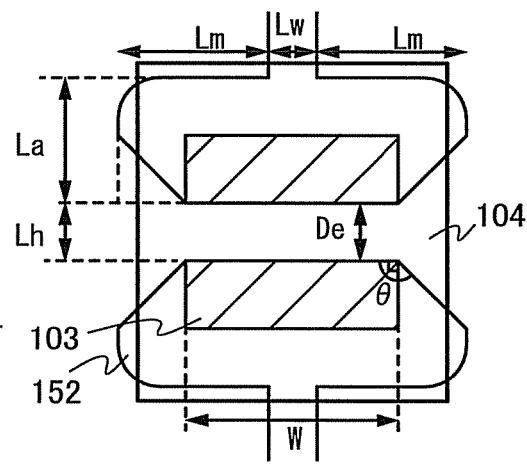

Further, FIG. 2E illustrates another example of the top surface shape of a connecting electrode. The top surface shape of a connecting electrode 152 is a shape of which width increases continuously from the width between both ends of one side in a direction apart from the centerline in the longitudinal direction of the chip component and which partly has circular arcs. FIG. 1A is an example in which the top surface shape of the connecting electrode is an inequilateral hexagonal shape having two internal angles which are right angles, whereas FIG. 2E is an example in which the top surface shape of the connecting electrode is a shape which has circular arcs instead of two internal angles which are right angles. With such a top surface shape of the connecting electrode 152, the chip component 104 can be mounted without being inclined and misaligned as in the case of the top surface shape illustrated in FIG. 1A.

Alternatively, the top surface shape of a connecting electrode may be a shape combining at least two of features in shape illustrated in FIG. 2A to FIG. 2E. Note that a common reference numeral refers to the same part in FIG. 1A and FIGS. 2A to 2E for simplicity.

Embodiment 2

In this embodiment, an example is described in which a chip having a bottom electrode structure is mounted on a circuit board by using a connecting electrode having a smaller top surface than the connecting electrode described in Embodiment 1.

Figure 3A:
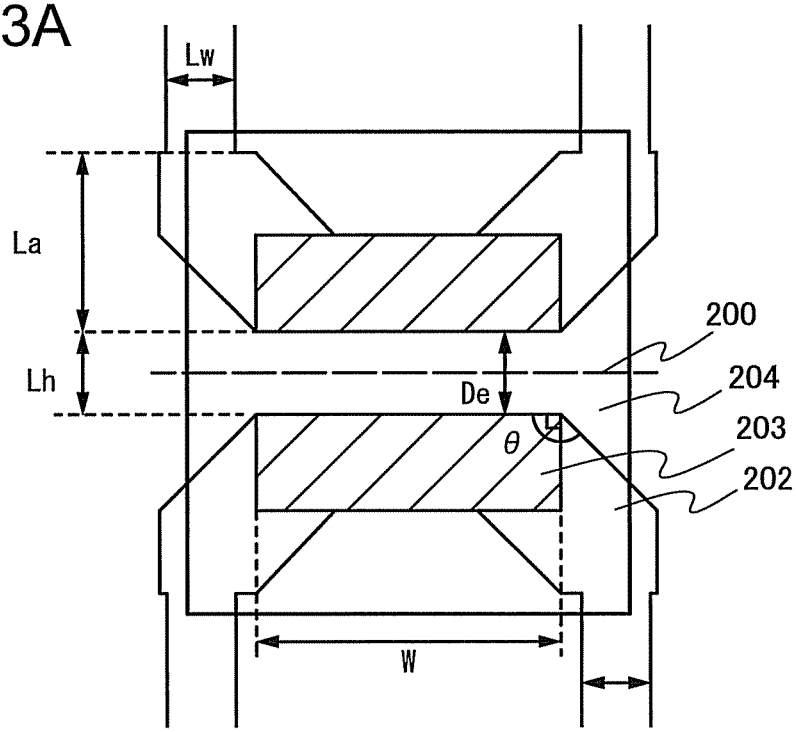
FIGS. 3A and 3B are top views illustrating other examples of positional relation between a terminal electrode and a connecting electrode of a chip component.

FIG. 3A illustrates an example of a top view of a mount structure.

In this embodiment, a chip component 204 with the same size as that of the chip component described in Embodiment 1 is used. A bottom surface of the chip component 204 is provided with two terminal electrodes 203 which are parallel to a centerline in the longitudinal direction of the chip component. The distance between the two terminal electrodes $D_e$ is 0.3 mm. The size of each of terminal electrodes 203 is also the same as that of the terminal electrode in Embodiment 1.

Two connecting electrodes 202 are provided over a circuit board. The connecting electrodes 202 are overlapped with the terminal electrodes 203 with the solder therebetween and the chip component 204 is mounted on the circuit board. Cream solder is printed on the two connecting electrodes 202 provided over the circuit board to mount the chip component 204 on the two connecting electrodes 202. Then, the cream solder is heated to be melted in a reflow furnace, whereby solder joint is performed. Thus, a mount structure illustrated in a top view of FIG. 3A can be obtained. Note that solder between the terminal electrode 203 and the connecting electrode 202 is not illustrated for simplicity in FIG. 3A.

The top surface shape of the connecting electrode 202 is an inequilateral hexagonal shape of which two internal angles are each 90 degrees, from which a trapezoidal shape (an isosceles trapezoid with an upper base of 0.2 mm and a lower base of 0.8 mm) is cut in a middle part adjacent to a long side of 1.5 mm of the inequilateral hexagonal shape. The area of one of the connecting electrodes 202 is 0.70 mm$^2$.

Note that the two connecting electrodes 202 are axisymmetrical with respect to the centerline 200 in the longitudinal direction of the chip component, which is shown by dashed line in FIG. 3A.

Further, two corner portions located at both ends of the long side of the terminal electrode 203 are made to correspond to corner portions located at both ends of one side of the connecting electrode 202 which is as long as the long side of the terminal electrode. Further, the internal angle θ at the vertex of the connecting electrode corresponding to the vertex of the terminal electrode is set to larger than 90 degrees and smaller than 180 degrees, so that a self-alignment effect can be achieved in the solder reflow process. Here, the internal angle θ at the vertex of the connecting electrode is set to 135 degrees.

Figure 3B:
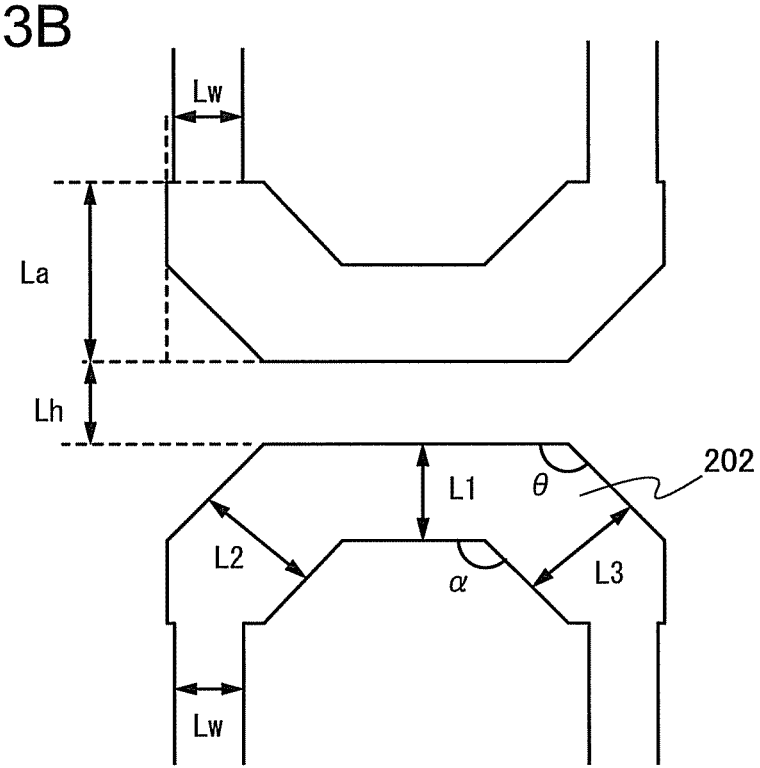

Further, FIG. 3B illustrates only the top surface shape of the connecting electrode 202. As illustrated in FIG. 3B, it can also be said that the top surface shape of the connecting electrode 202 is a shape having a bent portion of which middle part between one end and the other end protrudes. It can also be said that the top surface shape of the connecting electrode 202 is a V shape. Note that the top surface shape of the connecting electrode 202 is a shape of which outer rim of the bent portion is not acute unlike a V shape. The outer rim of the bent portion does not form an acute angle; thus, it can also be said that the top surface shape of the connecting electrode 202 is rather like a C shape or a U shape. The two connecting electrodes 202 are provided so that the protruding bent portions are closest to each other with a centerline in the longitudinal direction of the chip component interposed therebetween and the distance between connecting electrodes $L_h$ is 0.3 mm. Further, as illustrated in FIGS. 3A and 3B, a width $L_1$ of the bent portion of the connecting electrode 202 is larger than a wiring width $L_w$ and is equal to the length of the short side of the terminal electrode, which is 0.35 mm. Further, both a width $L_2$ in an end portion and a width $L_3$ in the other end portion of the connecting electrode 202 are each larger than the width $L_1$ of the bent portion.

Thus, a reason why the top surface shape of the connecting electrode 202 is a shape having an end portion and a middle portion which have different widths is described with reference to FIGS. 4A and 4B and FIGS. 16A and 16B.

Figure 16A:
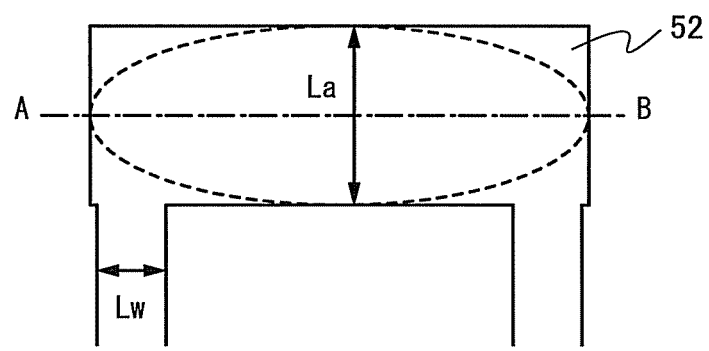
FIGS. 16A and 16B are a top view of a quadrangular connecting electrode and a cross-sectional view illustrating a behavior of solder melted on the quadrangular connecting electrode.
Figure 16B:
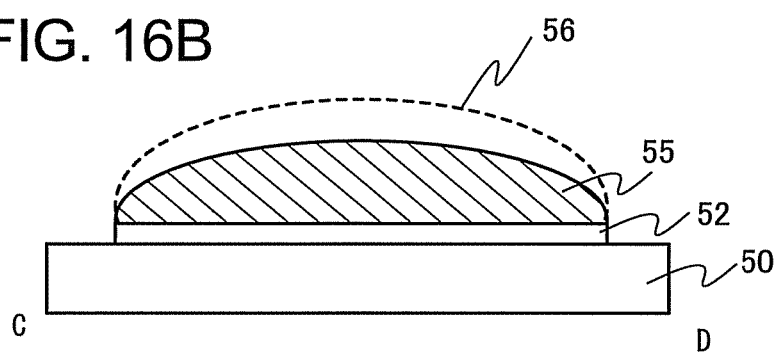

FIG. 16A is a top view of a quadrangular connecting electrode 52. In the case where solder cream is formed without a chip component mounted on the connecting electrode 52 provided over a printed board 50 and is melted, melted solder 55 rises so as to be a semi-ellipsoid (or a hemisphere) with a diameter equal to the width La of the connecting electrode 52 due to surface tension. However, since the connecting electrode 52 has a rectangular shape with four corners, the melted solder 55 cannot be a semi-ellipsoid and spreads as illustrated in FIG. 16B. FIG. 16B is a cross-sectional view taken along dashed-dotted line A-B in FIG. 16A. As illustrated in FIG. 16B, the melted solder 55 rises in at a center portion of the connecting electrode and the periphery of the top of the solder becomes a highest portion of the solder. If the top surface shape of the connecting electrode 52 is not a quadrangular shape but an elliptical or circular shape, a dotted line 56 in FIG. 16B corresponds to the surface of the solder.

Figure 4A:
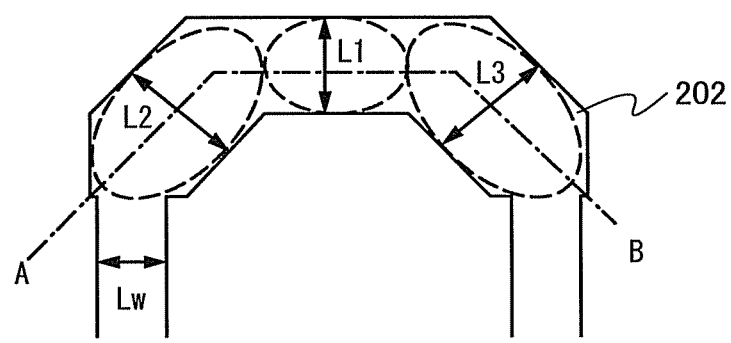
FIGS. 4A and 4B are a top view of a connecting electrode and a cross-sectional view illustrating a behavior of solder melted on the connecting electrode, respectively.
Figure 4B:
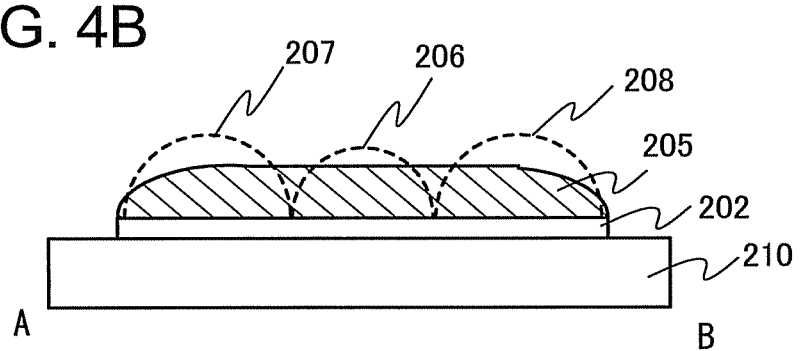

Further, FIG. 4A is a top view illustrating one of the two connecting electrodes 202 illustrated in FIG. 3B. In the case where solder cream is formed without a chip component mounted on the connecting electrode 202 and is melted, melted solder 205 rises due to surface tension so as to be three hemispheres with diameters equal to the widths $L_1$, $L_2$, and $L_3$ of the connecting electrode 202, respectively, (a hemisphere 206 with a diameter of $L_1$, a hemisphere 207 with a diameter of $L_2$, a hemisphere 208 with a diameter of $L_3$ which are shown by dotted lines in FIG. 4B). Melted solder on a connecting electrode having a complex top surface shape is likely to be a hemisphere with a diameter equal to a width of a relatively large region of the top surface shape. Both end portions and a middle portion of the connecting electrode 202 can be regarded as three regions having large areas and solder rises with the centers of the regions corresponding to the centers of the hemispheres and moves to be stable. FIG. 4B is a cross-sectional view taken along dashed-dotted line A-B in FIG. 4A. The melted solder has fluidity, and three regions of the solder move, so that the height of the solder is averaged as illustrated in FIG. 4B and the area having a uniform height increases as compared to FIG. 16B. It can also be said that the top surface shape of the highest portion of the solder is like a banana shape.

In the case where a chip component is mounted on the connecting electrodes 202 provided over the printed board 210, it is preferable that the width $L_2$ and the width $L_3$ be equal to each other and the width $L_1$ be smaller than the width $L_2$ and the width $L_3$ so that self-alignment effect can be achieved.

If a plurality of connecting electrodes are provided with respect to one terminal electrode, for example, in the case where four connecting electrodes are provided with respect to two terminal electrodes, there is a possibility that by performing a reflow process with a chip component mounted, the chip component may be inclined because solders have different heights. Further, in the case where a plurality of connecting electrodes are provided with respect to one terminal electrode, there is a portion which is not overlapped with the terminal electrode between the two connecting electrodes, solder is not attached to an entire surface of the terminal electrode, and the surface of the terminal electrode is partially exposed; therefore, fixing strength is reduced.

To ensure fixing strength, it is necessary that at least the area of part of the connecting electrode, which is overlapped with the terminal electrode, is the same as the area of the terminal electrode, that is, the connecting electrode is completely overlapped with the terminal electrode.

The connecting electrode 202 having a shape illustrated in FIG. 3B is practically formed experimentally, the chip component is mounted, and whether the chip component is inclined is checked. In addition, as a comparative example, comparison with a sample on which rectangular connecting electrodes 32 are mounted in FIG. 15A is performed. The angle formed by the bottom surface of the chip component and a substrate surface is measured by a measuring instrument (the digital microscope VHX-100 and the lens VH-Z450 manufactured by Keyence Corporation).

Figure 5:
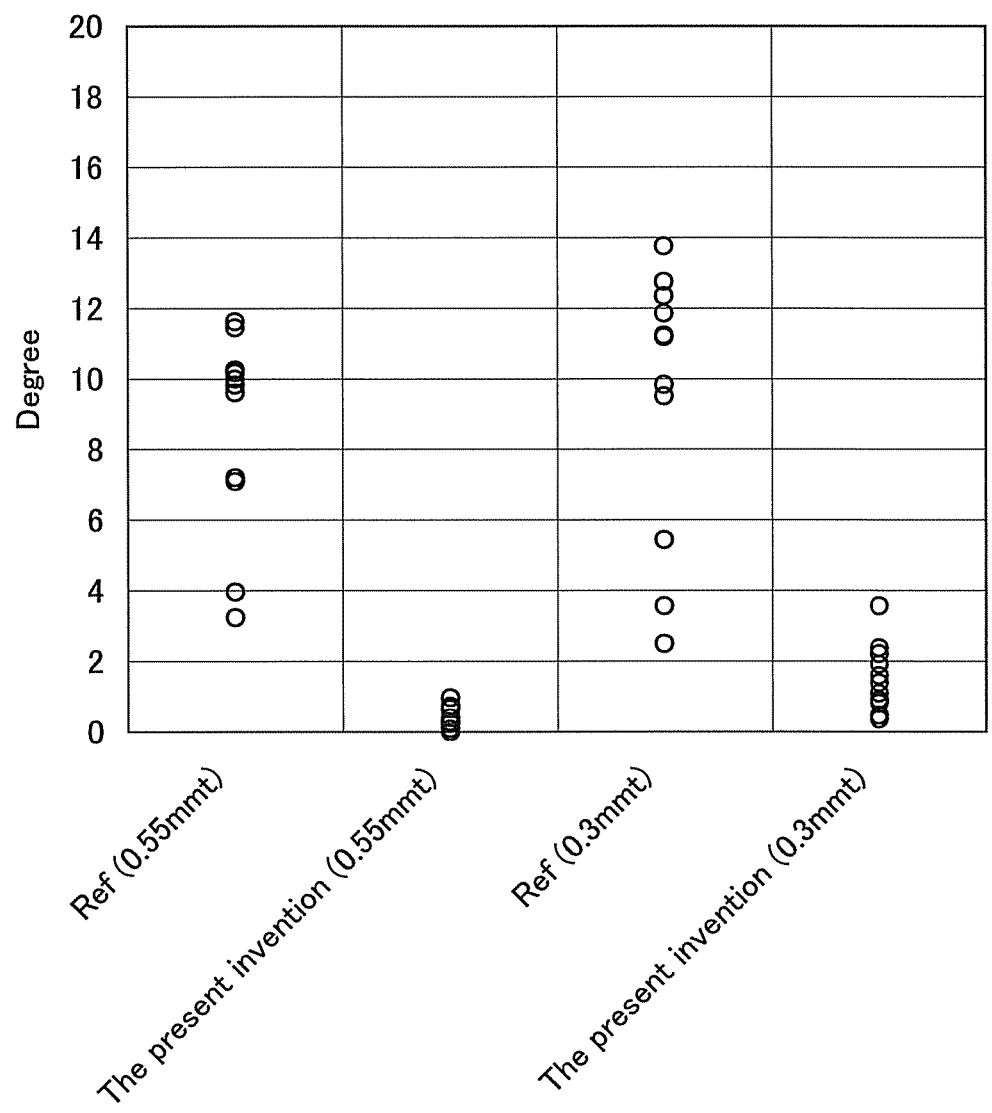
FIG. 5 is an experimental result showing variation of inclination angles of a chip component.

Further, FIG. 5 shows results obtained by forming 11 samples each using a chip with a thickness of 0.55 mm and 11 samples each using a chip with a thickness of 0.3 mm.

Table 1 shows maximum values, minimum values, and average values of obtained angles.

TABLE 1

|         | Ref (0.55 mmt) | The present invention (0.55 mmt) | Ref (0.3 mmt) | The present invention (0.3 mmt) |
|---------|----------------|----------------------------------|---------------|---------------------------------|
| max.(°) | 11.62          | 0.96                             | 13.76         | 3.56                            |
| min.(°) | 3.23           | 0                                | 2.5           | 0.36                            |
| ave.(°) | 8.58           | 0.36                             | 9.45          | 1.51                            |

According to the results, it can be said that the shape of the connecting electrode illustrated in FIG. 3B is advantageous in the mount structure of the chip with a thickness of 0.55 mm because the inclination angle is smaller than 2 degrees and there is even a sample with an inclination angle of 0 degree. The inclination angle of 0 degree means that the bottom surface of a chip and the top surface of a circuit board are parallel.

Figure 6A:
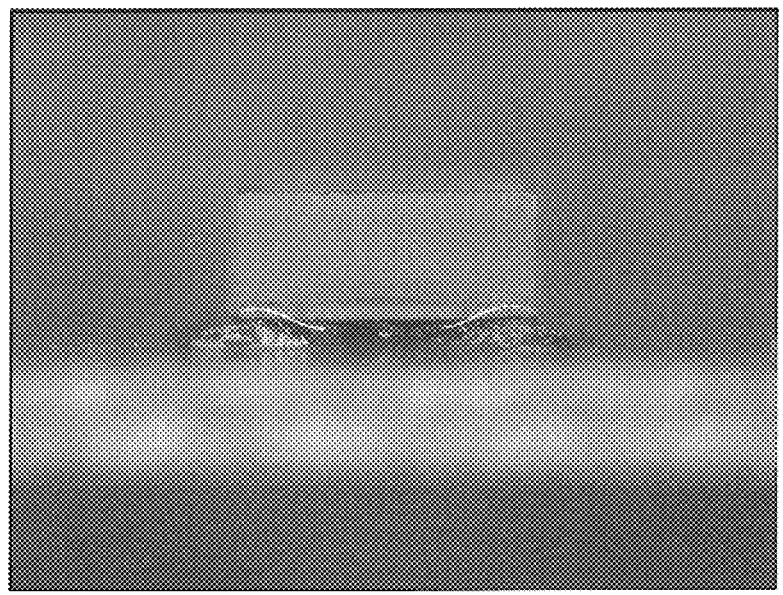
FIGS. 6A and 6B are a photographic view illustrating a mount structure shot from a side and a cross-sectional schematic view illustrating the mount structure, respectively.
Figure 6B:
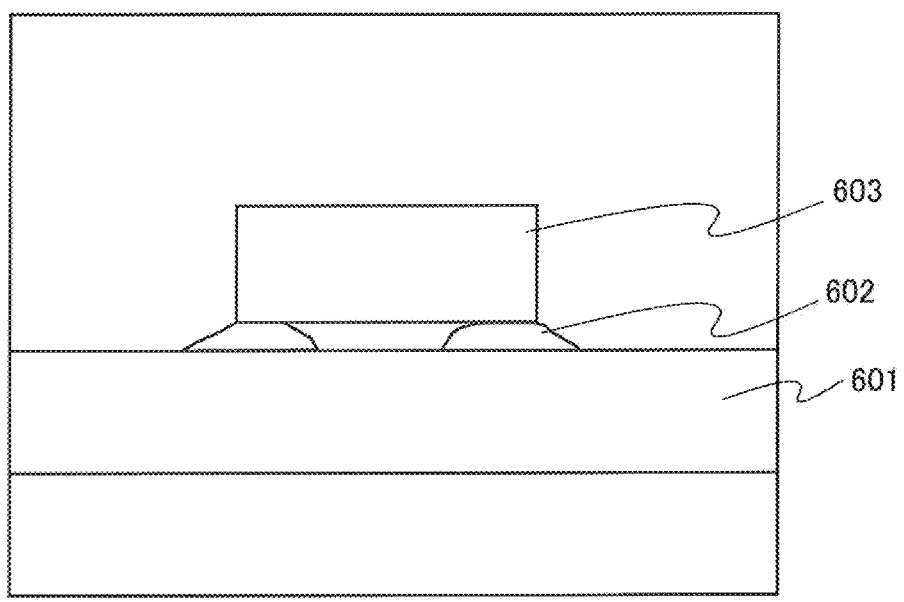

Further, FIG. 6A illustrates a photographic view shot from a side of a sample mounted with a chip having a thickness of 0.55 mm with an inclination angle of 0 degree. Further, FIG. 6B illustrates a schematic view of the sample. In FIG. 6B, a chip component 603 is mounted on a substrate 601 with solder 602 therebetween.

Further, even in the case of a sample mounted with a chip with a thickness of 0.3 mm, an inclination angle can be smaller than 4 degrees and thus variation is significantly reduced as compared to the comparative example. In addition, the chip component can be mounted without being misaligned so much.

Therefore, the shape of the connecting electrode illustrated in FIG. 3B is significantly advantageous in mounting through a solder reflow process. Here, description is made by comparing the chip with a thickness of 0.55 mm and a chip with a thickness of 0.3 mm; however, the upper limit of the thickness of the chip is not limited to 0.55 mm. It is needless to say that the lower limit of the thickness of the chip is not limited to 0.3 mm.

Further, although FIG. 3A illustrates an example in which one connecting electrode is provided with two wirings, the present invention is not particularly limited thereto as long as one end portion of the connecting electrode is provided with at least one wiring.

Further, the top surface shape of the connecting electrode illustrated in FIG. 3A is only an example. The top surface shape of the connecting electrode is allowable as long as it is different from that of the terminal electrode and is a shape having a bent portion protruding between an end portion and the other end portion. In addition, the top surface shape of the connecting electrode is a shape in which the width $L_1$ of the bent portion is larger than the length of a short side of the terminal electrode and the width $L_2$ in one end portion and the width $L_3$ in the other end portion of the bent portion are each larger than the width $L_1$ of the bent portion. Further, as for positional relation between the two connecting electrodes, they are provided so that protruding bent portions are closest to each other with a centerline in the longitudinal direction of the chip component interposed therebetween.

Figure 7A:
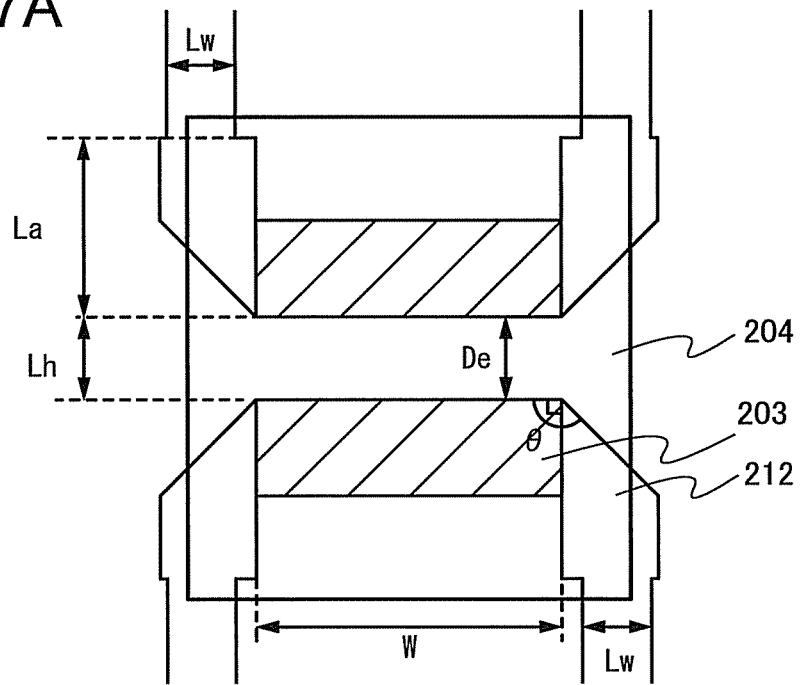
FIGS. 7A and 7B are top views illustrating other examples of positional relation between a terminal electrode and a connecting electrode of a chip component.

Further, FIG. 7A illustrates another example of the top surface shape of a connecting electrode. The area of the top surface shape of a connecting electrode 212 is smaller than that of FIG. 3A and is 0.61 mm². Further, the area of the connecting electrode 212 is smaller than that of FIG. 15A (0.65 mm²) which is for the comparative example. The top surface shape of the connecting electrode 212 is the same as that of FIG. 3A in that it is a decagonal shape but is different from that of FIG. 3A in that four of ten vertex angles are overlapped with four vertex angles of one terminal electrode. With such a top surface shape of the connecting electrode 212, the chip component 204 can be mounted without being inclined and misaligned as in the case of the top surface shape illustrated in FIG. 3A.

Figure 7B:
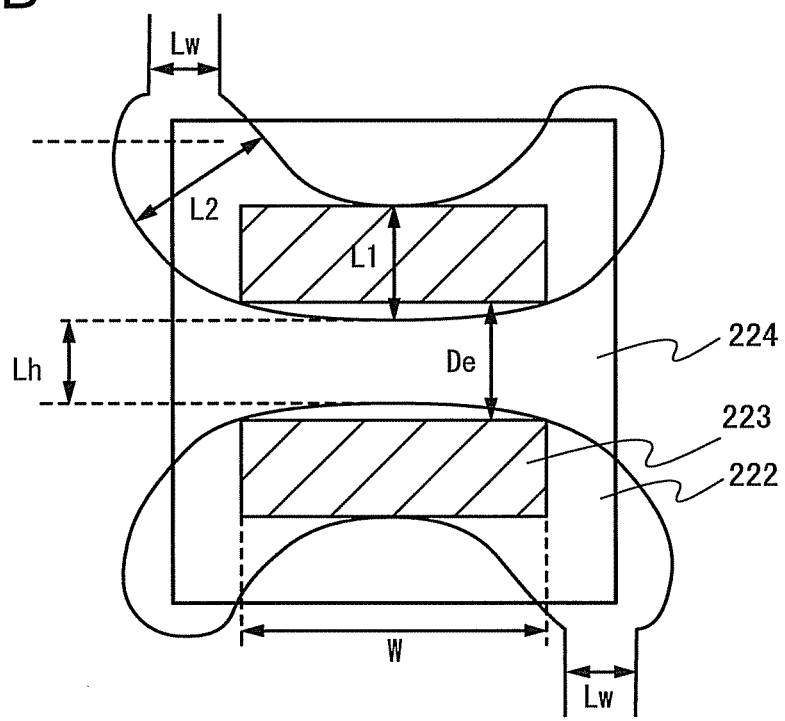

FIG. 7B illustrates another example of the top surface shape of a connecting electrode. The top surface shape of a connecting electrode 222 is a banana shape having a curved outer rim. Therefore, it is neither a circular shape nor an elliptical shape but is a complex shape having no vertices, that is, an irregular shape. Mounting is performed so that two vertices of the terminal electrode 223 overlap with two points of an outer rim of the connecting electrode 222. Further, in FIG. 7B, the distance between terminal electrodes $D_e$ is longer than the distance between connecting electrodes $L_h$ unlike in the cases of other mount structures. Thus, the distance between terminal electrodes $D_e$ is not necessarily limited to 0.3 mm and may be set appropriately depending on the size of a chip component 224 or the shape of a connecting electrode.

In FIG. 7B, the distance between connecting electrodes $L_h$ is 0.3 mm and the distance between terminal electrodes $D_e$ is longer than 0.3 mm.

Although an example in which one side of the terminal electrode and one side of the connecting electrode are overlapped with each other as illustrated in FIG. 1A and FIGS. 2A to 2E is described in Embodiment 1, the present invention is not particularly limited thereto. As for the top surface shape of the connecting electrode, one side of the connecting electrode does not necessarily correspond to one side of the terminal electrode. The top surface shape of the connecting electrode is allowable as long as at least part of the terminal electrode 223 is overlapped with the terminal electrode and the area of part of the connecting electrode, which is overlapped with the terminal electrode, is the same as the area of the terminal electrode as illustrated in FIG. 7B.

With such a top surface shape of the connecting electrode 222, the chip component 224 can be mounted without being inclined and misaligned as in the case of the top surface shape illustrated in FIG. 3A.

Further, this embodiment can be freely combined with Embodiment 1. For example, the top surface shape of the connecting electrode may have a circular arc which is curved outward instead of one side of the connecting electrode, that is, one side which is linear and corresponds to one side of the terminal electrode and the positions of the terminal electrodes may be changed so that the distance between terminal electrodes $D_e$ is longer than the distance between connecting electrodes $L_h$.

Embodiment 3

Figure 8:
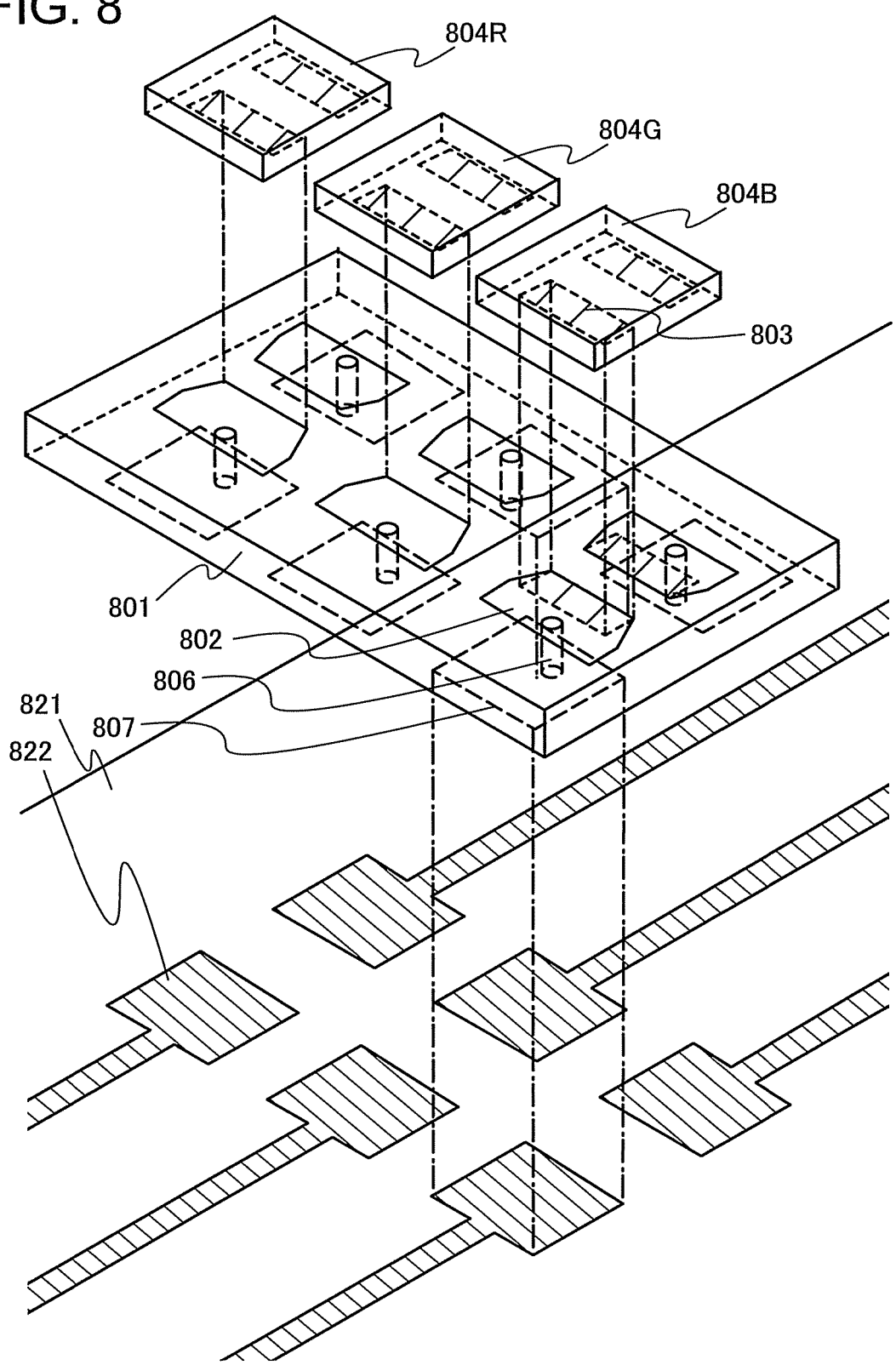
FIG. 8 is a perspective exploded view.

This embodiment mode describes an example in which an interposer (also referred to as a buffer substrate) is used as a first circuit board and a printed wiring board is used as a second circuit board with reference to FIG. 8.

FIG. 8 is a perspective exploded view illustrating the positional relation among components, and mounting is performed so that two points connected with a dashed-dotted line are overlapped with each other. Note that solder is not illustrated in FIG. 8.

Here, an example is described in which after three kinds of minute chips are mounted on a substrate for forming an interposer, the substrate for forming an interposer is divided to form one interposer and then the interposer is mounted on a printed board. Note that as the substrate for forming an interposer, an insulating substrate in which a glass woven fabric is impregnated with an epoxy resin, or the like is used.

A light receiving element 804R having a red color filter, a light receiving element 804G having a green color filter, and a light receiving element 804B having a blue color filter are prepared. Each of the light receiving elements has two first terminal electrodes 803 on a bottom surface thereof and a color filter on a top surface thereof and senses light incident from the top surface side.

Each of the three light receiving elements is provided with a color filter, whereby a red color component, a green color component, and a blue color component of incident light can be selectively received and thus wavelength sensitivity of the light receiving elements can be conformed to that of a human eye. Further, the light receiving element may be provided with another optical film if necessary. It is needless to say that an optical film such as a color filter which resists a reflow process in mounting without difficulty is used.

In this embodiment, a chip provided with a sensor element using a diode and a circuit (output amplifier circuit including a thin film transistor) electrically connected to the sensor element is used. Light incident to the diode (photodiode) is absorbed by a photoelectric conversion layer to generate light charges. The amount of light charges generated by the light depends on the amount of light absorbed by the photoelectric conversion layer. The light charges generated by the light is amplified by a circuit including a TFT and detected. As the diode, a Schottky diode having a structure in which a photoelectric conversion layer is sandwiched between a first electrode and a second electrode is used. Here, as a photoelectric conversion element which converts light into an electric signal, a PIN diode, a PN diode, an avalanche diode, or the like may be used instead of the diode having the above structure.

For example, as another structure, a photoelectric conversion layer sandwiched between a first electrode and a second electrode may be a single i-type (intrinsic) semiconductor layer, a single p-type semiconductor layer, or a single n-type semiconductor layer. Alternatively, as another structure, a photoelectric conversion layer sandwiched between a first electrode and a second electrode may have a two-layer structure including an i-type (intrinsic) semiconductor layer and an n-type semiconductor layer, an i-type (intrinsic) semiconductor layer and a p-type semiconductor layer, or a p-type semiconductor layer and an n-type semiconductor layer.

Note that a PIN photodiode includes a pair of electrodes, a p-type semiconductor layer, an n-type semiconductor layer, and an i-type (intrinsic) semiconductor layer sandwiched between the p-type semiconductor layer and the n-type semiconductor layer.

When the light receiving elements are mounted on one interposer 801, if a bottom surface of the light receiving element and the top surface of the interposer are inclined (not parallel to each other), the angle of incident light is changed due to the inclination, which may possibly change an output value.

In this embodiment, six first connecting electrodes 802 each having an inequilateral hexagonal top surface shape of which two angles are overlapped with two angles of the first terminal electrode 803 are provided on a top surface of the interposer. Since the top surface shape of the first connecting electrode 802 is described in Embodiment 1, specific description thereof is omitted for simplicity. The first connecting electrode 802 has an inequilateral hexagonal top surface shape, so that the three light receiving elements can be stably connected without being inclined in solder reflow. In addition, by a self-alignment effect due to the top surface shape of the first connecting electrode 802, misalignment can be prevented.

Note that the interposer has via holes 806 that penetrate therethrough and is provided on an inner side than the outline of the first connecting electrode 802. Further, the interposer has second terminal electrodes 807 on a bottom surface thereof. At the time of mounting, a conductive paste is printed to be fill the via holes 806. Note that since a conductive film is formed on a surface of an inner wall of each of the via holes, even in the case where a conductive paste is not printed to fill the via holes, the first connecting electrodes 802 and the second terminal electrodes 807 are electrically connected. The conductive paste is the one in which conductive particles each with a grain diameter of from several nanometers to several tens of nanometers are dissolved or dispersed in an organic resin. As the conductive particle, at least one of metal particles such as silver (Ag), gold (Au), copper (Cu), nickel (Ni), platinum (Pt), palladium (Pd), tantalum (Ta), molybdenum (Mo), and titanium (Ti) or a microparticle of silver halide can be used. It is needless to say that a microparticle containing solder or lead-free solder as its main component may be used.

Further, the interposer has the six second terminal electrodes 807 on the bottom surface thereof and the six second terminal electrodes 807 and six second connecting electrodes 822 provided on a printed board 821 are subjected to solder bonding. Thus, the interposer 801 has six supporting points, so that it is stably mounted on the printed board 821 and mounting is stably performed in solder reflow. The second connecting electrode 822 preferably has an area which is as large as or larger than that of the second terminal electrode 807.

By thus using the interposer 801, the interposer 801 can be fixed to the printed board 821 at six portions having large areas with solder; therefore, bonding strength can be sufficiently ensured.

Further, although an example in which three chips are mounted on the interposer is described in this embodiment, the present invention is not particularly limited thereto. For example, in the case where an interposer is obtained by mounting one chip on a substrate for forming an interposer and then performing cutting has a bottom electrode structure including two terminal electrodes, the shape of the connecting electrode according an embodiment of the present invention can be used as the shape of a connecting electrode of a printed board on which an interposer is mounted.

Further, although the interposer having via holes is illustrated as an example in FIG. 8, the present invention is not particularly limited thereto and an interposer having electrodes on an end surface may be used. Alternatively, an interposer having a solder ball on a bottom surface thereof may be used.

Figure 9:
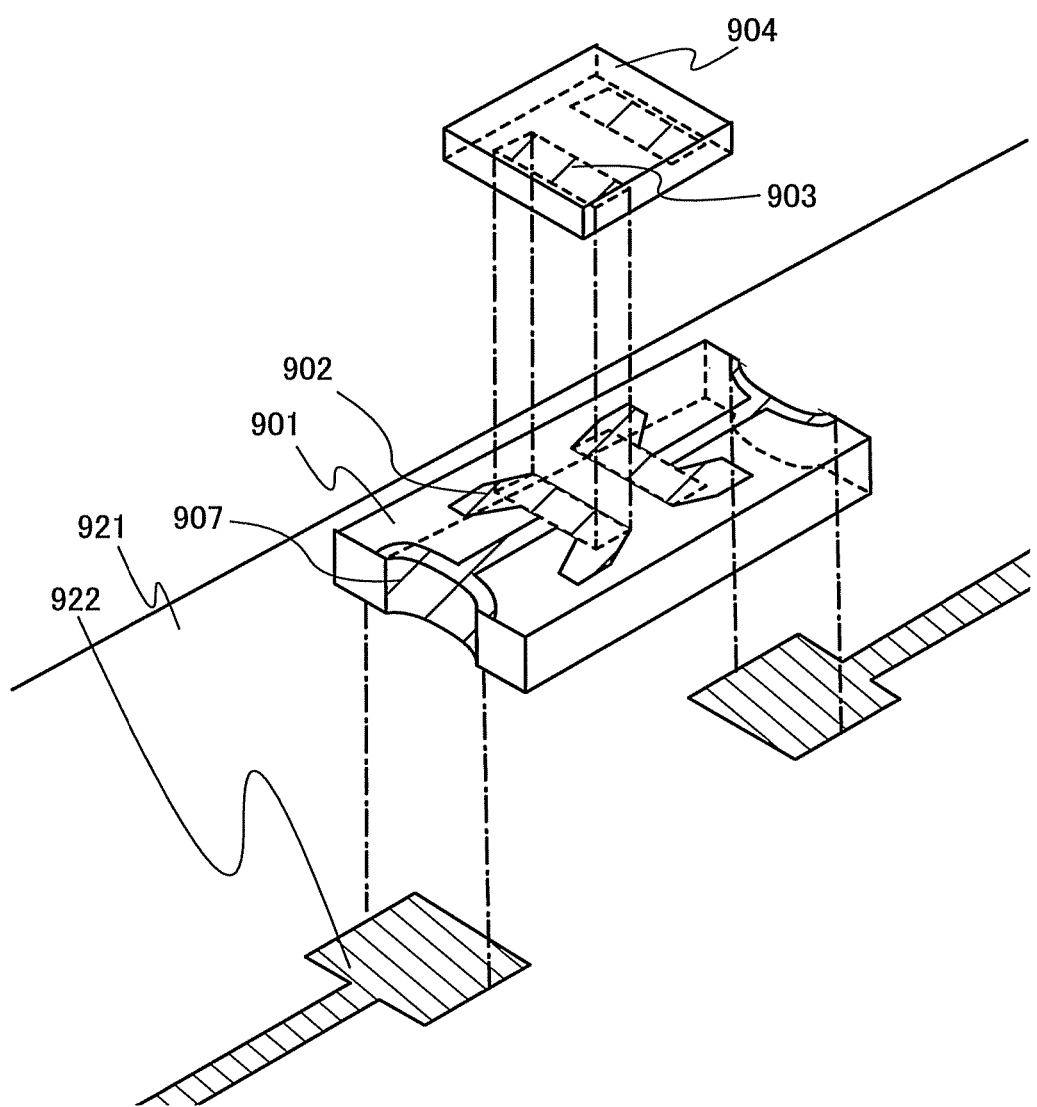
FIG. 9 is a perspective exploded view.

Further, FIG. 9 illustrates an example in which an interposer 901 having electrodes on an end surface thereof is mounted with one chip component 904. FIG. 9 is a perspective exploded view illustrating the positional relation among components, and mounting is performed so that two points connected with a dashed-dotted line are overlapped with each other.

An end surface of the interposer 901 illustrated in FIG. 9 is provided with electrodes 907 having divided through holes penetrating from a top surface to a bottom surface of the interposer. The electrode 907 on the end surface is electrically connected to the first connecting electrode 902 on the top surface of the interposer with a wiring extended from the electrode 907 to the first connecting electrode 902. Further, a bottom electrode extended from the electrode 907 on the end surface may be provided on the bottom surface of the interposer. The top surface shape of the first connecting electrode 902 is substantially the same as that of FIG. 3A described in Embodiment 2. The top surface shape of the first connecting electrode 902 is different from that of FIG. 3A in a portion at which connection is made with a wiring pattern having the width $L_w$.

A solder paste is printed on the first connecting electrode 902 of the substrate for forming an interposer and the substrate is put into a reflow furnace, so that the terminal electrode 903 of the chip component 904 and the first connecting electrode 902 of the interposer 901 are connected to each other. Note that a solder paste is selectively printed so as not to be attached to the wiring pattern having the width $L_w$. By employing the top surface shape of the first connecting electrode 902 of the substrate for forming an interposer, mounting is performed so that the bottom surface of the chip component 904 can be parallel to the top surface of the substrate for forming an interposer.

After that, the substrate for forming an interposer is cut to have a desired shape to form the interposer 901. Then, a solder paste is printed on the second connecting electrode 922 of the printed board 921 and the printed board 921 is put into a reflow furnace, so that the second connecting electrode 922 of the printed board 921 and the electrode 907 of the interposer 901 are connected to each other. After this reflow process, a solder fillet is formed in the vicinity of the electrode 907 on the end surface of the interposer so that the electrode 907 is electrically connected to the second connecting electrode 922 of the printed board 921.

In this case, the interposer 901 also has two terminals, so that inclination might be caused. Therefore, in the case where the interposer 901 has two terminals, the interposer preferably has a via hole structure. Further, the shape illustrated FIG. 1A is employed as the top surface shape of the second connecting electrode of the printed board 921, whereby inclination can be reduced.

The present invention including the above structures is described more specifically in Embodiments 4 to 6.

Embodiment 4

In this embodiment, examples of a variety of electronic appliances on each of which a chip component is mounted are described. Examples of electronic appliances to which an embodiment of the present invention is applied include a computer, a display, a mobile phone, a television device, and the like.

Figure 10:
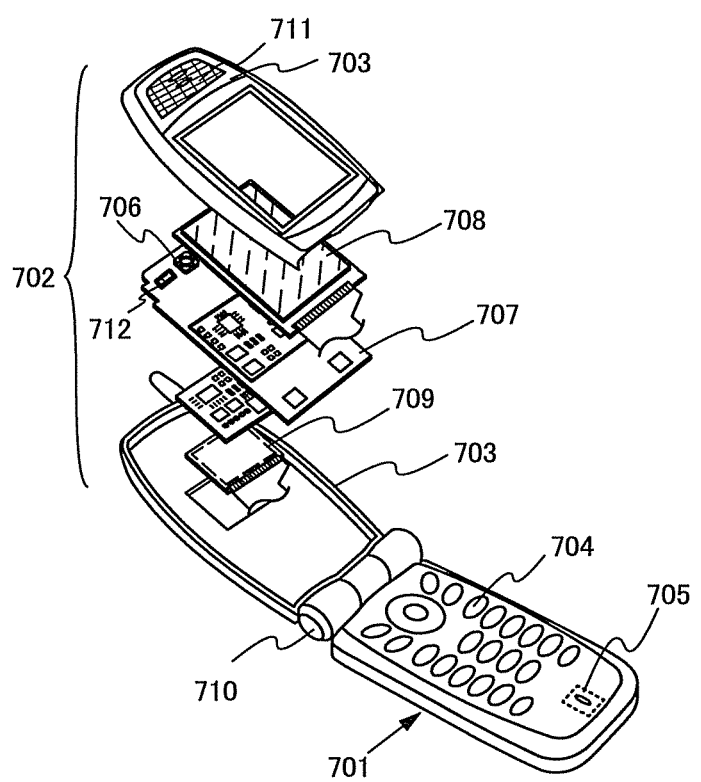
FIG. 10 is a diagram illustrating a device on which a semiconductor device according to an embodiment of the present invention is mounted.

FIG. 10 illustrates a mobile phone including a main body (A) 701, a main body (B) 702, a chassis 703, operation keys 704, a sound output portion 705, a sound input portion 706, a circuit board 707, a first display panel 708, a second display panel 709, a hinge 710, a light-transmitting material portion 711, and a sensor 712.

The sensor 712 detects light transmitted through the light-transmitting material portion 711, and luminance of the first display panel 708 and the second display panel 709 is controlled based on illuminance of detected ambient light, or illumination of the operation keys 704 is controlled based on illuminance obtained by the sensor 712. Accordingly, current consumption of the mobile phone can be suppressed. According to an embodiment of the present invention, the sensor 712 having a bottom electrode structure can be mounted with solder with high yield. Further, according to an embodiment of the present invention, when mounting and connecting a small chip component having a bottom electrode structure including two terminal electrodes (for example, a tantalum capacitor having a bottom electrode structure) on/to a circuit board as well as the sensor, high-density mounting and highly-reliable connecting can be achieved.

Figure 11A:
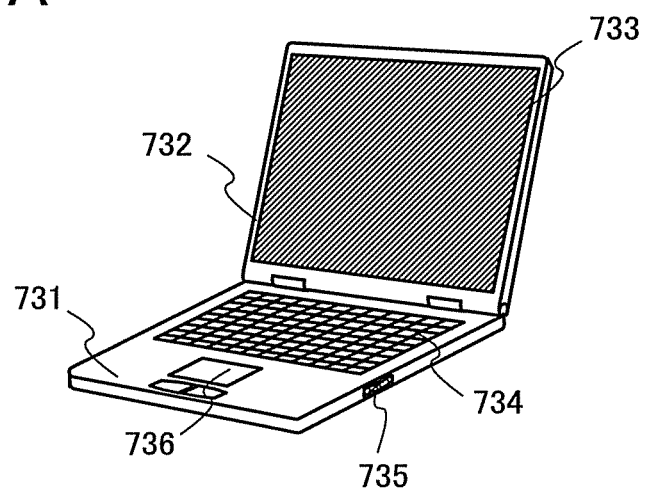
FIGS. 11A and 11B are diagrams each illustrating a device on which a semiconductor device according to an embodiment of the present invention is mounted.

FIG. 11A illustrates a computer including a main body 731, a housing 732, a display portion 733, a keyboard 734, an external connection port 735, a pointing device 736, and the like.

Figure 11B:
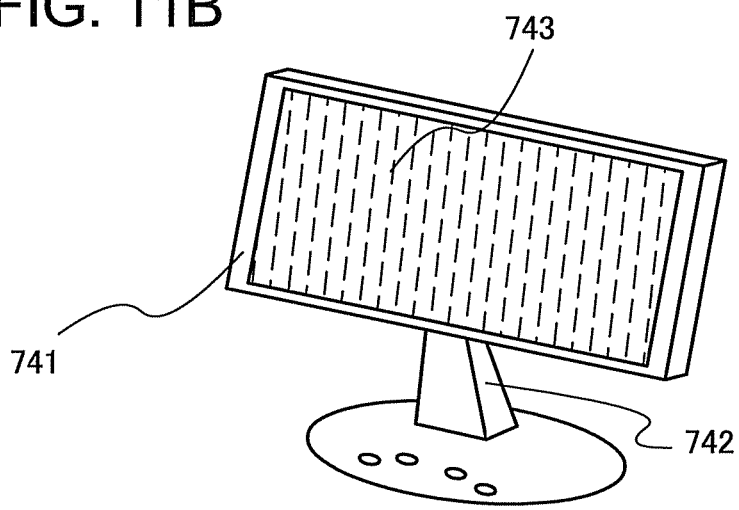

FIG. 11B illustrates a television device, an example of a display device. The television device includes a housing 741, a supporting board 742, a display portion 743, and the like.

Figure 12:
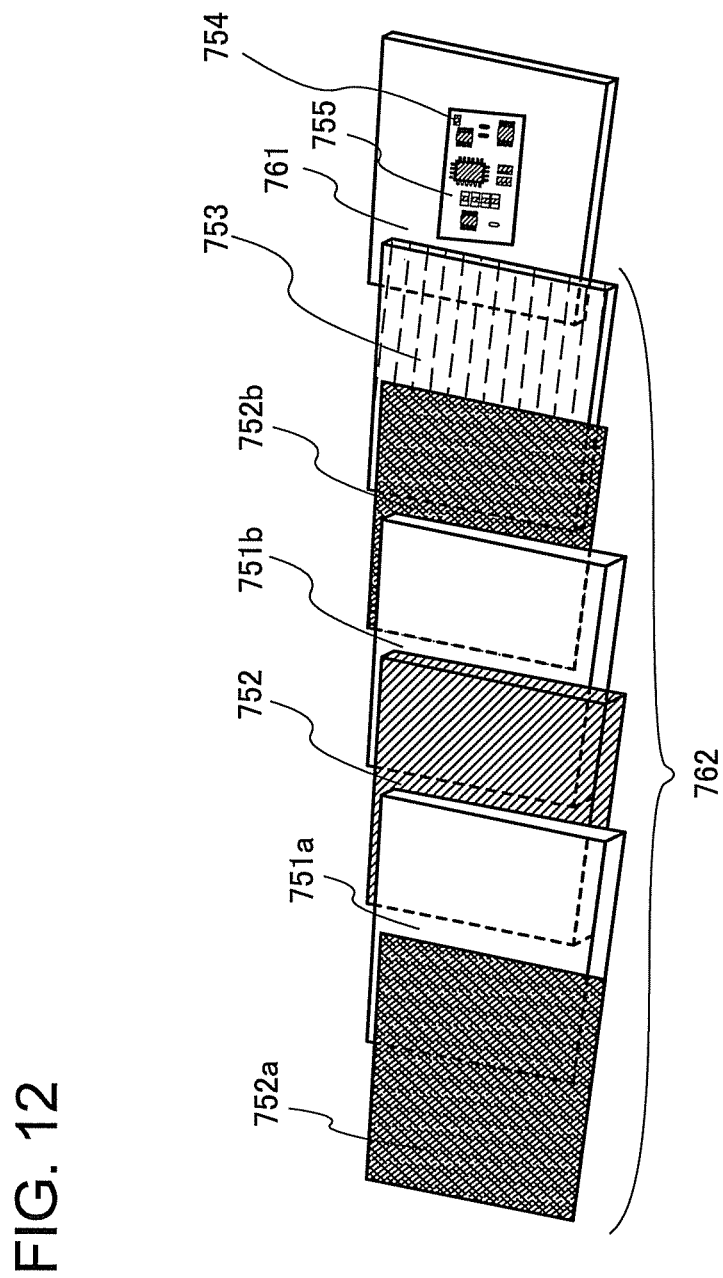
FIG. 12 is a diagram illustrating a device on which a semiconductor device according to an embodiment of the present invention is mounted.

FIG. 12 illustrates a detailed structure in the case of using a liquid crystal panel as a display portion 733 provided in a computer illustrated in FIG. 11A, and as the display portion 743 of the display device illustrated in FIG. 11B.

A liquid crystal panel 762 illustrated in FIG. 12 is incorporated in a housing 761 and includes a substrate 751a, a substrate 751b, a liquid crystal layer 752 sandwiched between the substrate 751a and the substrate 751b, a polarizing filter 752a, a polarizing filter 752b, a backlight 753, and the like. Further, a circuit board 722 mounted with a sensor 754 is fixed in the housing 761.

The sensor 754 which is mounted on a circuit board 755 by using an embodiment of the present invention detects the amount of light from the backlight 753, and the information is fed back for adjusting luminance of the liquid crystal panel 762. Further, according to an embodiment of the present invention, when mounting and connecting a small chip component having a bottom electrode structure including two terminal electrodes (for example, a tantalum capacitor having a bottom electrode structure) on/to the circuit board 755 as well as the sensor 754, high-density mounting and highly-reliable connecting can be achieved.

Figure 13A:
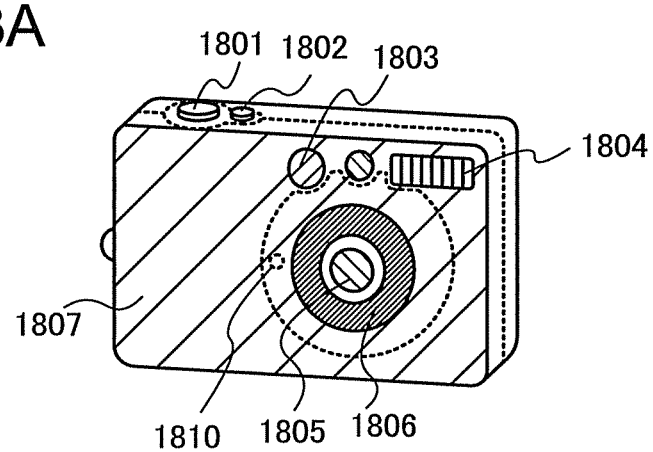
FIGS. 13A and 13B are diagrams each illustrating a device on which a semiconductor device according to an embodiment of the present invention is mounted.
Figure 13B:
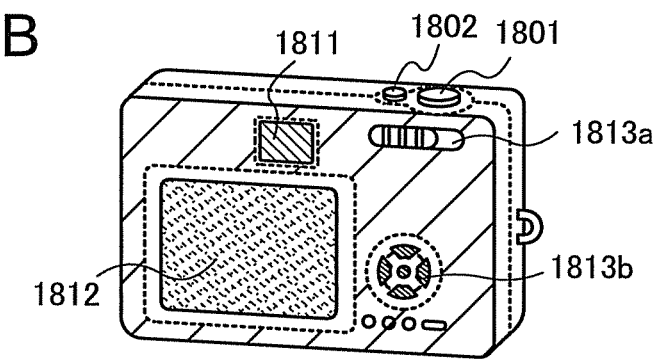
Figure 14A:
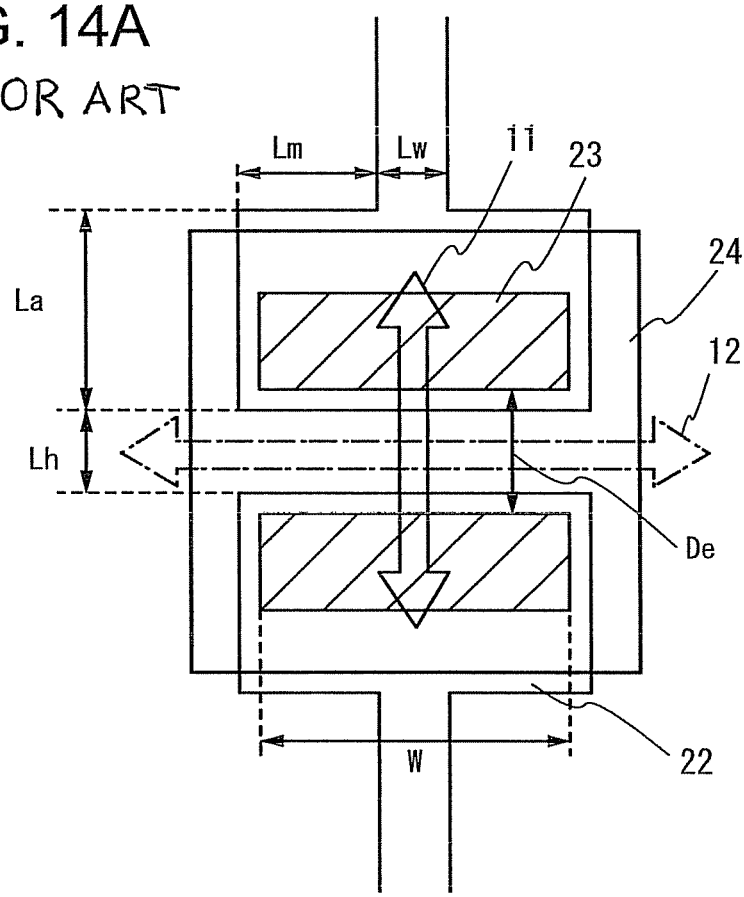
FIGS. 14A and 14B are a top view and a cross-sectional view illustrating a comparative example, respectively.
Figure 14B:
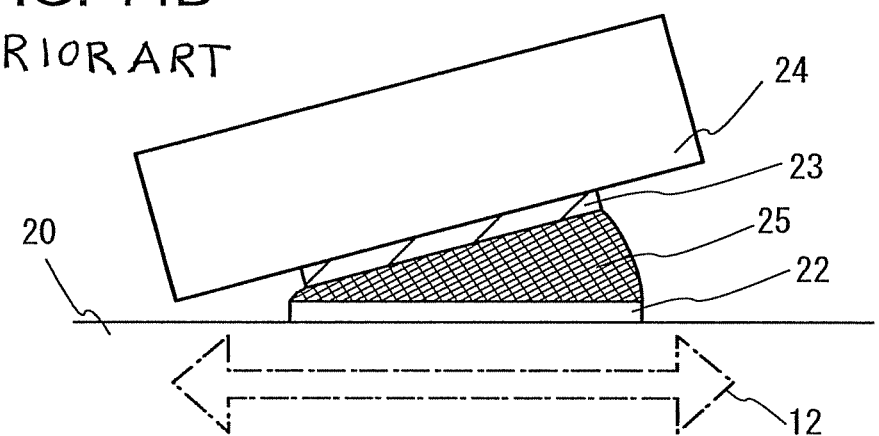

FIGS. 13A and 13B illustrate an example of a camera such as a digital camera including a sensor 1810 mounted using an embodiment of the present invention. FIG. 13A is a perspective view seen from the front side of the digital camera, and FIG. 13B is a perspective view seen from the back side of the digital camera. In FIG. 13A, the digital camera is provided with a release button 1801, a main switch 1802, a viewfinder 1803, a flash portion 1804, a lens 1805, a lens barrel 1806, a housing 1807, and the sensor 1810.

Further, in FIG. 13B, the digital camera is provided with a viewfinder eyepiece 1811, a monitor 1812, and operation buttons 1813a and 1813b.

When the release button 1801 is pressed down halfway, a focusing adjusting mechanism and an exposure adjusting mechanism are operated, and when the release button is fully pressed down, a shutter is opened.

By pushing down or rotating the main switch 1802, a power source of the digital camera is switched on and off.

The viewfinder 1803 is placed at the upper part than the lens 1805 of the front side of the digital camera and is a device for recognizing an area which is shot or a focus position from the viewfinder eyepiece 1811 illustrated in FIG. 13B.

The flash portion 1804 is placed at the upper part of the front side of the digital camera, and when object luminance is low, supporting light is emitted at the same time as the release button is pressed down so that the shutter is opened.

The lens 1805 is located at the front side of the digital camera and formed of a focusing lens, a zoom lens, and the like. The lens forms a photographic optical system with a shutter and a diaphragm which are not illustrated. In addition, an image sensor such as a CCD (charge coupled device) is provided behind the lens.

The lens barrel 1806 moves a lens position to adjust the focus of the focusing lens, the zoom lens, or the like. When a picture is shot, the lens barrel is slid out to move the lens 1805 forward. Further, when the digital camera is carried, the lens 705 is moved backward so that the digital camera is compact. Note that a structure is employed in this embodiment, in which the object can be zoomed to be shot by sliding out the lens barrel; however, the present invention is not limited to this structure. Alternatively, a structure may be employed for the digital camera, in which zoom shooting can be conducted without sliding out the lens barrel with the use of the structure of a photographic optical system inside the chassis 1807.

The viewfinder eyepiece 1811 is provided at the upper part of the back side of the digital camera, for recognizing an area which is shot or a focus position.

The operation buttons 1813 are buttons having various functions, which are provided at the back side of the digital camera, and include a set up button, a menu button, a display button, a function button, a selection button, and the like.

When the sensor 1810 is mounted on a circuit board incorporated in the camera illustrated in FIGS. 13A and 13B by applying an embodiment of the present invention, the sensor 1810 can sense whether light exists and the light intensity and thus, exposure adjustment or the like of the camera can be performed. Even in the case where the thickness of the sensor is 0.3 mm, which is small, high-density mounting and highly-reliable connecting can be achieved. Miniaturization of a component such as the sensor is effective particularly when the component is used for portable electronic appliances.

Note that this embodiment can be combined with any of Embodiments 1 to 3 as appropriate.

Embodiment 5

Figure 17:
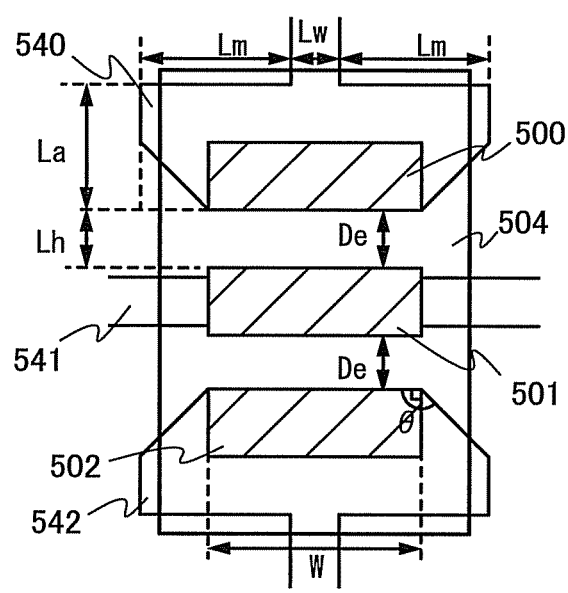
FIG. 17 is a top view illustrating another example of positional relation between a terminal electrode and a connecting electrode of a chip component.

This embodiment describes an example in which a chip component having three terminal electrodes are mounted on a printed board. FIG. 17 is a top view in which three terminal electrodes provided on a bottom surface of the chip component overlap with and are connected to three connecting electrodes provided on the printed board.

As illustrated in FIG. 17, a rectangular chip component 504 is provided with a first terminal electrode 500, a second terminal electrode 501, and a third terminal electrode 502 which are arranged in one direction.

In the case where the three terminal electrodes are arranged in one direction as illustrated in FIG. 17, such a problem which occurs when the chip components having two terminal electrodes is mounted in Embodiment 1 might occur.

To solve such a problem, a trapezoidal shape is employed as the top surface shape of a first connecting electrode 540 overlapped with the first terminal electrode 500, an upper base of the first connecting electrode 540 is set to be as long as a long side of the first terminal electrode 500, and mounting is performed so that the upper base of the first connecting electrode 540 is overlapped with the long side of the first terminal electrode 500.

Further, a trapezoidal shape is employed as the top surface shape of a third connecting electrode 542 overlapped with the third terminal electrode 502, an upper base of the third connecting electrode 542 is set to be as long as a long side of the third terminal electrode 502, and mounting is performed so that the upper base of the third connecting electrode 542 is overlapped with the long side of the third terminal electrode 502.

In the case where a chip component having three terminal electrodes arranged in one direction is mounted on a printed board, the shape illustrated in FIG. 17 is employed as the shape of one of two connecting electrodes connected to two terminal electrodes provided at one end and the other end of the chip component among a plurality of terminal electrodes with solder therebetween, whereby the chip component 504 can be mounted without being inclined and misaligned. Note that although the shape of the second connecting electrode 541 provided between the first connecting electrode 540 and the third connecting electrode 542 is the same as the second terminal electrode 501 in FIG. 17, the shape of the second terminal electrode 501 is not particularly limited as long as the second terminal electrode 501 and an adjacent electrode is not short-circuited. Further, the second connecting electrode 541 is preferably an electrode for setting a potential at the ground potential (GND).

Further, the combination of the shape of the first connecting electrode 540 and the shape of the third connecting electrode 542 is not limited to that in FIG. 17. Any of the combinations illustrated in FIGS. 2A to 2E, FIG. 3A, and FIGS. 7A and 7B may be employed.

Further, although an example in which a chip component having three terminal electrodes is described, the present invention is not limited thereto. In the case of mounting a chip component having four or more terminal electrodes arranged in one direction, the shape of the first connecting electrode 540 illustrated in FIG. 17 may be employed as the shape of one of two connecting electrodes connected to two terminal electrodes provided at one end and the other end of the chip component among a plurality of terminal electrodes with solder therebetween, and the shape of the third connecting electrode 542 may be employed as the shape of the other.

Note that in the case where all of three or more terminal electrodes provided on a chip component are not arranged in one direction, inclination is reduced. Therefore, in the case of mounting a chip component having three or more terminal electrodes which are not arranged in one direction on a circuit board, the chip component is fixed to the circuit board by the three or more terminal electrodes, so that enough fixing strength to the circuit board can be achieved. Since enough fixing strength can be achieved, there is no particular limitation on the shape of the connecting electrode of the circuit board. In the case of such multiple pin mounting, three or more supporting points are not linearly arranged; therefore, the mounting state is stabilized and mounting is performed even in solder reflow.

Embodiment 6

Table 2 shows results obtained under the condition where the shape of two terminal electrodes illustrated in FIG. 3B is employed, and connecting electrodes each having a different internal angle $\theta$ are formed within the range of larger than or equal to 90 degrees and smaller than 180 degrees at a vertex of the connecting electrode which corresponds to a vertex of the terminal electrode, and a chip component is mounted on each of the connecting electrodes. Note that the internal angle $\theta$ and an angle $\alpha$ are set to equal to each other in the shape of the terminal electrode illustrated in FIG. 3. Experiments are performed using printed boards on which a plurality of connecting electrodes having different internal angles $\theta$ are formed, and mounting states of three printed boards are visually confirmed.

TABLE 2

| θ(°) | 175 | 165 | 155 | 145 | 135 | 125 | 115 | 105 | 95 | 90 |
|---|---|---|---|---|---|---|---|---|---|---|
| Sample substrate 1 | x | x | ○ | ○ | ○ | ○ | ○ | ○ | x | x |
| Sample substrate 2 | x | x | ○ | ○ | ○ | ○ | ○ | ○ | x | x |
| Sample substrate 3 | x | x | ○ | ○ | ○ | ○ | ○ | ○ | x | x |

According to the results in Table 2, by setting the internal angle θ to be from 105 to 155 degrees, favorable mounting can be performed. In the case of mounting the chip component on the connecting electrode having the angle θ of 90, 95, 165, or 175 degrees, a mounting defect such as large inclination or misalignment of the chip component is confirmed.

This application is based on Japanese Patent Application serial no. 2008-159260 filed with Japan Patent Office on Jun. 18, 2008, the entire contents of which are hereby incorporated by reference.

What is claimed is:

1. A printed board comprising:
   at least a first connecting electrode, and a second connecting electrode over a circuit board,
   wherein a chip component including a first terminal electrode and a second terminal electrode is provided over the first connecting electrode and the second connecting electrode,
   wherein only one of the first connecting electrode and the second connecting electrode has one cut portion, and
   wherein the cut portion is not overlapped with the first terminal electrode or the second terminal electrode.

2. The printed board according to claim 1, wherein a top surface of each of the first connecting electrode and the second connecting electrode has an inequilateral hexagonal shape.

3. The printed board according to claim 1, wherein the first connecting electrode and the second connecting electrode have larger areas than the first terminal electrode and the second terminal electrode, respectively.

4. A printed board comprising:
   at least a first connecting electrode, and a second connecting electrode over a circuit board,
   wherein:
   a first solder is provided over the first connecting electrode, and a second solder is provided over the second connecting electrode,
   a chip component is provided over the first solder, and the second solder, the chip component including a first terminal electrode, and a second terminal electrode,
   the first connecting electrode is overlapped with the first terminal electrode and is electrically connected to the first terminal electrode through the first solder,
   the second connecting electrode is overlapped with the second terminal electrode and is electrically connected to the second terminal electrode through the second solder,
   only one of the first connecting electrode and the second connecting electrode has one cut portion, and
   the cut portion is not overlapped with the first terminal electrode or the second terminal electrode.

5. The printed board according to claim 4, wherein a top surface of each of the first connecting electrode and the second connecting electrode has an inequilateral hexagonal shape.

6. The printed board according to claim 4, wherein the first connecting electrode and the second connecting electrode have larger areas than the first terminal electrode and the second terminal electrode, respectively.

* * * * *